US012238888B2

(12) United States Patent
Rivaud et al.

(10) Patent No.: US 12,238,888 B2
(45) Date of Patent: Feb. 25, 2025

(54) AUXILIARY CABLE ORGANIZATION STRUCTURE FOR NETWORK RACK SYSTEM

(71) Applicant: Ciena Corporation, Hanover, MD (US)

(72) Inventors: Daniel Rivaud, Ottawa (CA); Anthony Mayenburg, Carp (CA)

(73) Assignee: Ciena Corporation, Hanover, MD (US)

( * ) Notice: Subject to any disclaimer, the term of this patent is extended or adjusted under 35 U.S.C. 154(b) by 682 days.

(21) Appl. No.: 17/372,817

(22) Filed: Jul. 12, 2021

(65) Prior Publication Data

US 2023/0010285 A1    Jan. 12, 2023

(51) Int. Cl.
*H05K 7/14* (2006.01)
*G02B 6/44* (2006.01)
*H01R 25/00* (2006.01)

(52) U.S. Cl.
CPC ......... *H05K 7/1491* (2013.01); *G02B 6/4452* (2013.01); *H01R 25/006* (2013.01)

(58) Field of Classification Search
CPC ..... H05K 7/1491; G02B 6/4452; G02B 6/426
See application file for complete search history.

(56) References Cited

U.S. PATENT DOCUMENTS

| | | | |
|---|---|---|---|
| 5,778,130 A * | 7/1998 | Walters | G02B 6/44528 385/134 |
| 7,137,672 B2 | 11/2006 | Von Mayenburg et al. | |
| 8,154,867 B2 | 4/2012 | Shearman et al. | |
| 8,184,526 B2 | 5/2012 | Duncan et al. | |
| 8,630,315 B2 | 1/2014 | Rivaud et al. | |
| 8,776,161 B2 | 7/2014 | Gazier et al. | |
| 9,203,782 B2 | 12/2015 | Mayenburg et al. | |
| 9,603,289 B1 | 3/2017 | Shearman et al. | |
| 9,820,403 B2 | 11/2017 | Shearman et al. | |
| 9,836,931 B1 | 12/2017 | Rivaud et al. | |
| 9,843,439 B2 | 12/2017 | Rivaud et al. | |

(Continued)

FOREIGN PATENT DOCUMENTS

DE    102015108528 B4 *  6/2020  ............. F21V 14/06

OTHER PUBLICATIONS

Translation of DE_102015108528_B4 (Year: 2020).*

*Primary Examiner* — Chad H Smith
(74) *Attorney, Agent, or Firm* — Clements Bernard Walker; Christopher L. Bernard; Devin Cummins

(57) ABSTRACT

Network rack systems for physically supporting modules of a network element and cable management structures for maintaining network cables in an organized manner are provided. An auxiliary side cabinet, according to one implementation, includes a frame configured for physical attachment to a side portion of a main rack structure, where the main rack structure is configured to support a plurality of modules of a Network Element (NE). The auxiliary side cabinet further includes a front plane connected to a front portion of the frame. Also, the auxiliary side cabinet includes one or more connector panels supported on the front plane. Each of the one or more connector panels is configured to support a plurality of connectors. The plurality of connectors are configured for communication with associated connectors of the modules of the NE via cables. Also, the plurality of connectors are configured as high pin count connectors.

20 Claims, 22 Drawing Sheets

(56) References Cited

U.S. PATENT DOCUMENTS

| | | | |
|---|---|---|---|
| 9,847,752 B2 | 12/2017 | Rivaud et al. | |
| 10,012,811 B2 | 7/2018 | Rivaud et al. | |
| 10,247,895 B2 | 4/2019 | Rivaud et al. | |
| 10,263,609 B2 | 4/2019 | Estabrooks et al. | |
| 10,674,241 B2 | 6/2020 | Rivaud et al. | |
| 10,729,037 B1 | 7/2020 | Shearman et al. | |
| 10,736,227 B1 | 8/2020 | Rivaud et al. | |
| 10,764,189 B1 | 9/2020 | Rivaud et al. | |
| 10,855,623 B2 | 12/2020 | Estabrooks et al. | |
| 10,924,324 B2 | 2/2021 | Rivaud et al. | |
| 2005/0124180 A1 | 6/2005 | Simonovich et al. | |
| 2015/0362692 A1* | 12/2015 | Grandidge | G02B 6/4452 29/434 |
| 2017/0336903 A1 | 11/2017 | Rivaud et al. | |
| 2018/0077080 A1 | 3/2018 | Gazier et al. | |
| 2018/0188465 A1* | 7/2018 | Zer | G02B 6/4441 |
| 2018/0295737 A1* | 10/2018 | Balasubramanian | H04Q 1/02 |
| 2019/0327188 A1 | 10/2019 | Rivaud et al. | |
| 2020/0341218 A1 | 10/2020 | Leclair et al. | |

* cited by examiner

AUXILIARY CABLE ORGANIZATION STRUCTURE FOR NETWORK RACK SYSTEM

TECHNICAL FIELD

The present disclosure generally relates to racks used for physically supporting network elements. More particularly, the present disclosure relates to auxiliary cabinet structures connected to network racks for organizing cables.

BACKGROUND

Generally, a computer network includes a plurality of Network Elements (NEs) positioned at a number of sites. For example, each site may be configured as a data center or node within the network and may include a plurality of various types of modules, such as servers, switches, etc. Normally, these modules are arranged on a metal rack structure.

FIG. 1 is a diagram illustrating a front perspective view of a conventional rack structure 10 shown in an empty state. The rack structure 10 is configured for housing network equipment (e.g., modules) of a NE. For example, the rack structure 10 may include, among other things, four upright posts 12, 14, 16, 18, a left side panel 20, and a right side panel 22. The left side panel 20 may be connected to a front left post 12 and a back left post 14 and the right side panel 22 may be connected to a front right post 16 and a back right post 18.

FIG. 2 is a diagram illustrating a front perspective view of the conventional rack structure 10 of FIG. 1, where the rack structure 10 may include any size or shape of network rack, cabinet, chassis, etc. In this example, the conventional rack structure 10 is shown in a filled state, where a plurality of modules 26 of the NE are physically installed on the rack structure 10 between the left side panel 20 and the right side panel 22. The modules 26 may be connected to the rack structure 10 using conventional hardware components, such as nuts, bolts, screws, etc.

FIG. 3 is a diagram illustrating a back perspective view of the conventional rack structure 10 of FIG. 1. In this view, the rack structure 10 is filled with the modules 26 as shown in FIG. 2. Also, a back portion of most or all of the modules 26 may include conventional backplanes 30 having conventional backplane connectors 32. Each of the backplane connectors 32 is designed for connection with electrical or optical cables 34 at one end of the cables 34, whereby the other ends of the cables 34 may be connected to a fabric of a conventional NE. For example, the fabric of the network may include Top of Rack (TOR) servers, leaf layer servers, spine layer servers, core layer servers, and/or other network components. As a data center grows, the fabric (including the number of fabric-facing cables) may ultimately become more complex, and, as shown in FIG. 3, can become quite complicated and messy.

A Distributed Disaggregated Chassis (DDC) may use a plurality of cables 34, where each cable 34 may include a connector at each end thereof. A first connector at one end of the cable 34 is configured to be coupled with a corresponding backplane connector 32 and the other connector at the other end of the cable 34 is configured to be coupled with other connectors (not shown), corresponding to other modules in the same rack or different racks within the data center. For connection with the backplane connector 32, the connector of the cable 34 may include Quad Small Form-factor Pluggable (QSFP) connectors (also referred to as "plug-gables"). The QSFP include four parallel paths, as the name implies. In some cases, network equipment may include connector designed to be coupled with Double Density QSFP (QSFP-DD) connectors to enable eight parallel paths.

As demonstrated in FIG. 3, conventional networks can include a plurality of cables running in multiple different directions for connection with multiple different devices. Thus, as a network or data center grows, it can be difficult for a network technician to manage, track, and/or replace cables as needed for maintaining the data center. For example, the task of a network technician to install additional cables can be very time-consuming and can potentially result in human errors. Although networks may grow and be upgraded over time, the systems of cables can also become more and more chaotic.

In some cases, extra rack systems may include structures that leave unused cables unconnected and dangling in the air. These structures may have the granularity of the QSFP-DD and may therefore will have a lower maximum size. It can be a challenge for installers when the unused cables have unconnected ends dangling. Therefore, there is a need in the field of network systems to provide a rack or cabinet system that is configured to overcome the disadvantages of conventional systems and can ease the complexity of cable management as a network grows.

BRIEF SUMMARY

The present disclosure is directed to rack structures for supporting modules of a Network Element (NE), auxiliary side cabinet attached to rack structures, auxiliary rack structures include a main rack for supporting modules and an auxiliary side cabinet for managing cables, and cable management structures and systems. According to one implementation, an auxiliary side cabinet includes a frame configured for physical attachment to a side portion of a main rack structure, where the main rack structure is configured to support a plurality of modules of a NE. The auxiliary side cabinet further includes a front plane connected to a front portion of the frame and one or more connector panels supported on the front plane. Each of the one or more connector panels is configured to support a plurality of connectors. The plurality of connectors are configured for communication with associated connectors of the modules of the NE via cables. The plurality of plurality of connectors may the same as those connectors that are normally considered to be used as backplane-style connectors.

According to additional embodiments, the frame of the auxiliary side cabinet may include a width that is less than a width of the main rack structure. The auxiliary side cabinet may further include a back panel that supports one or more fabric-facing connectors. Also, the auxiliary side cabinet may further include internal cabling connecting the plurality of connectors with the fabric-facing connectors. For example, the internal cabling may include twin axial (twinax) cables and may include a shuffled arrangement.

Furthermore, the front-facing connectors may be configured for connection with corresponding connectors of optical cables. The corresponding connectors, for example, may be Quad Small Form-factor Pluggable-Double-Density (QSFP-DD) connectors. The plurality of connectors of each of the one or more connector panels may be arranged on the respective connector panel in a vertical orientation. The plurality of connectors may include one or more (e.g., eight) 40-link connectors and one or more (e.g., five) 64-link connectors. In some embodiments, a second auxiliary side cabinet may be attached to an opposite side portion of the main rack structure.

In some implementations, the auxiliary side cabinet may further include multiple connector panels having the same arrangement of front-facing connectors. One or more of the multiple connector panels may be arranged in a right-side-up orientation and one or more of the multiple connector panels may be arranged in an upside-down orientation. The plurality of connectors may include a first set of connectors configured for connection with packet modules, control modules, and universal modules of the NE mounted on the main rack structure and a second set of connectors configured for connection with fabric modules of the NE mounted on the main rack structure. The first set of connectors may be positioned on the respective connector panel near the packet modules, control modules, and universal modules, and the second set of connectors may be positioned on the respective connector panel near the fabric modules.

The auxiliary side cabinet, according to some implementations, may further include multiple connector panels having multiple different arrangements of the plurality of connectors. Each of the one or more connector panels may include separate sections, for example, where a first type of front-facing connector may be supported by a first section of the respective sectional connector panel and a second type of front-facing connector may be supported by a second section of the respective sectional connector panel. The cables described above for connecting the plurality of connectors with corresponding connectors of the modules of the NE may be octopus cables having a bulkhead connector for connection with the plurality of connectors and multiple Small Form-factor Pluggable (SFP) connectors for connection with multiple corresponding connectors of the modules of the NE. The plurality of connectors in some embodiments may include Multi-fiber Push-On (MPO) connecting elements.

BRIEF DESCRIPTION OF THE DRAWINGS

The present disclosure is illustrated and described herein with reference to the various drawings. Like reference numbers are used to denote like components/steps, as appropriate. Unless otherwise noted, components depicted in the drawings are not necessarily drawn to scale.

DETAILED DESCRIPTION

The present disclosure relates to rack structures or cabinet structures for physically supporting network modules in a manageable manner. In some embodiments of the present disclosure, the cabinet structures described herein may include auxiliary side cabinets connected to a main rack structure. Thus, to improve upon conventional rack structures, the present disclosure provides auxiliary cabinets positioned side-by-side with the conventional rack structures, where the auxiliary cabinets can be designed with some connectors arranged in a front-facing direction and some connectors arranged in a back-facing or fabric-facing direction.

The present application is related to patent application Ser. No. 16/778,041, the disclosure of which is incorporated by reference in the present disclosure. The related application includes a cassette that is mated directly to a fabric module, whereas auxiliary side cabinets described in the present disclosure are not mated directly to any modules, but instead are mounted to a main rack structure. The related application includes an external cable and an external connector, whereas the external cable is a separate unit in the present disclosure. The related application includes the cassette at the rear of the chassis behind the modules, whereas the structure of the present disclosure includes the auxiliary cabinets positioned to the side of the rack structures and not at the back, which thereby can consume less depth and can better meet certain depth requirements (e.g., 600 mm) according to various structural specifications. Also, the related application, in some implementations, may be used with special fabric modules having extra height, whereas the present disclosure describes systems that can be operate with conventional module heights as well as specially designed modules. Furthermore, with the position of the cassettes at the back section of the chassis in the related application, air flow could be a concern, whereas, in the present disclosure, the position of the auxiliary cabinets at the side does not interfere with front-to-rear air flow on the conventional modules.

A Network Element (NE) operating in a network, in accordance with the teachings of the present disclosure, may be cabled with individual Quad Small Form-factor Pluggable—Double-Density (QSFP-DD) cables, such as Direct Attached Cables (DACs). In some embodiments, the network may operate with 32AWG DAC cables, which may have the diameter and flexibility similar to CAT5 cables. The present disclosure is configured to improve the ease at which a network technician can install new cable. Also, the present disclosure is configured to reduce the number of installation errors, improve link budget, improve in-service upgradeability, etc.

Figure 1:
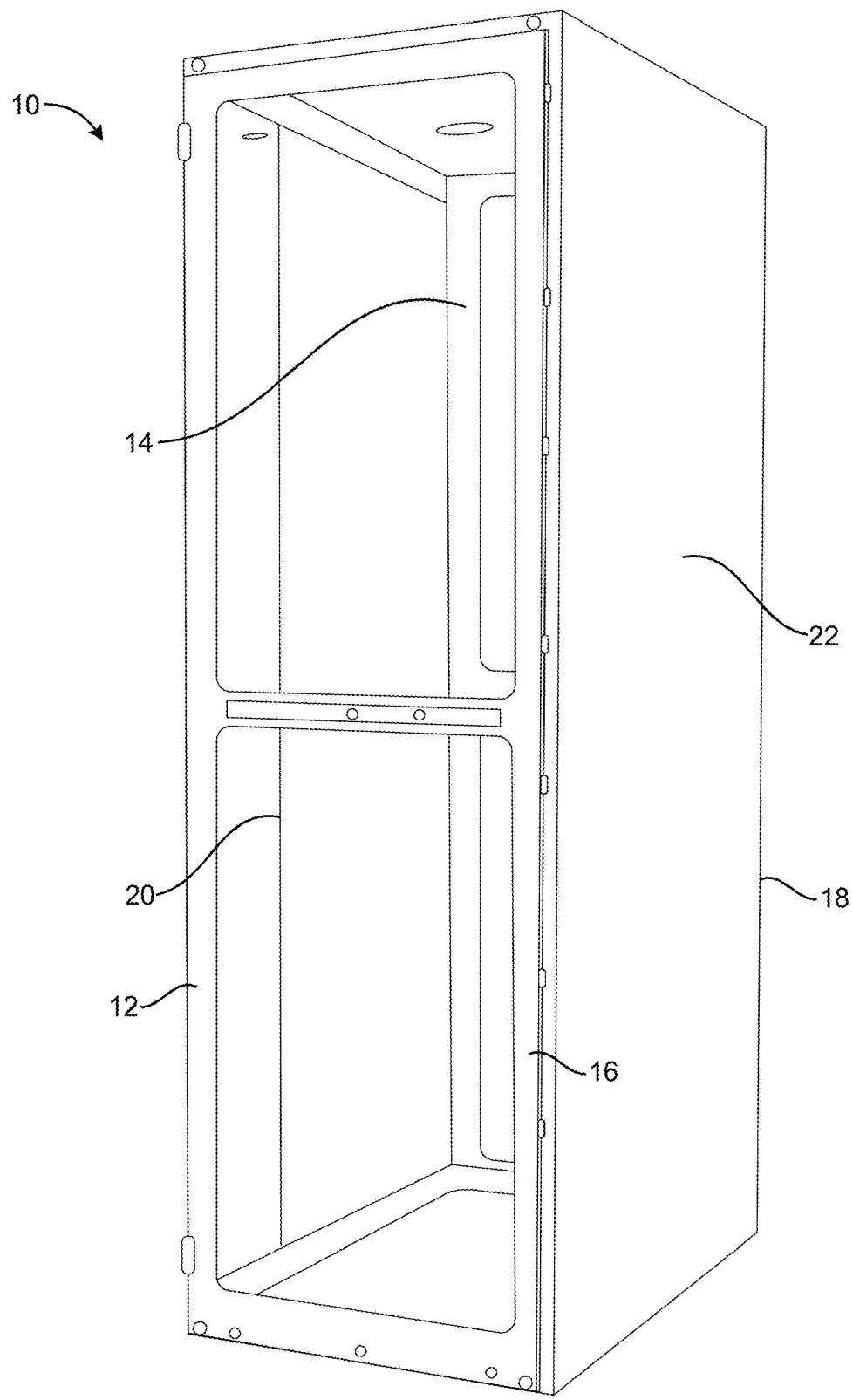
FIG. 1 is a diagram illustrating a front perspective view of a conventional rack structure shown in an empty state, the rack structure configured for housing network equipment of a Network Element (NE).
Figure 2:
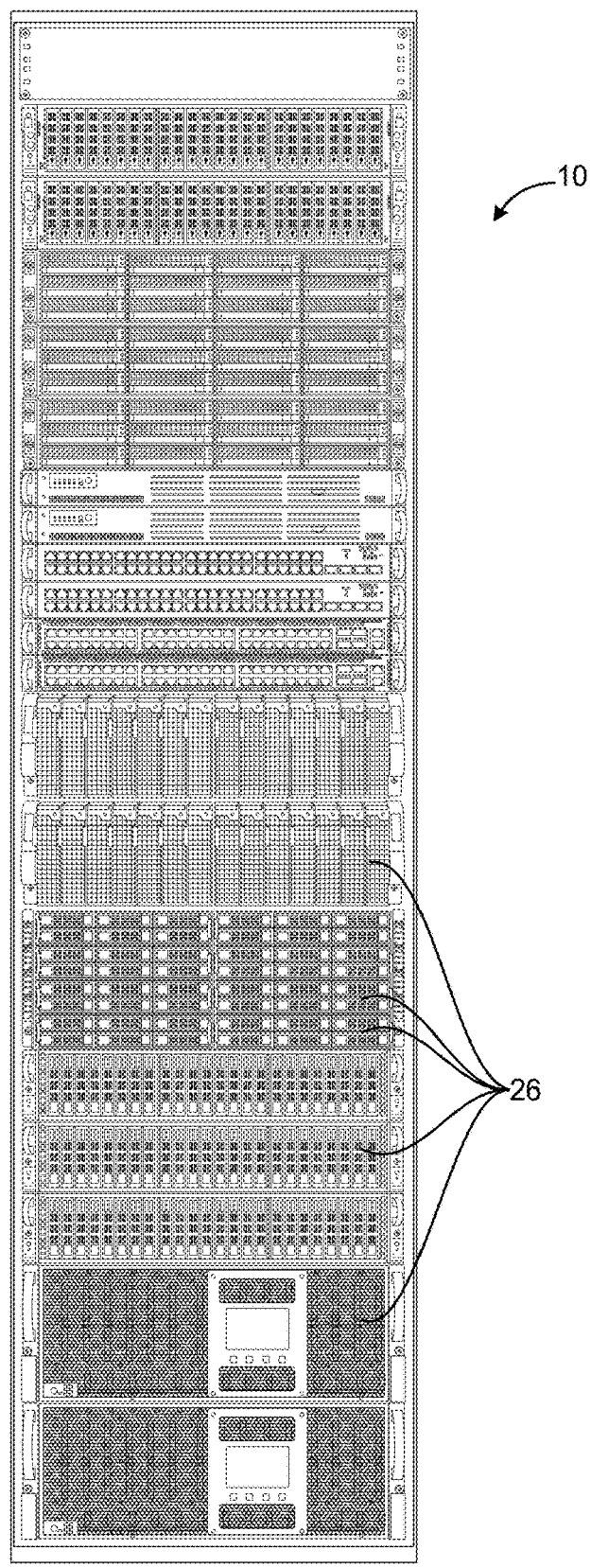
FIG. 2 is a diagram illustrating a front perspective view of the conventional rack structure of FIG. 1 shown in a filled state with a plurality of modules of a NE installed thereon.
Figure 3:
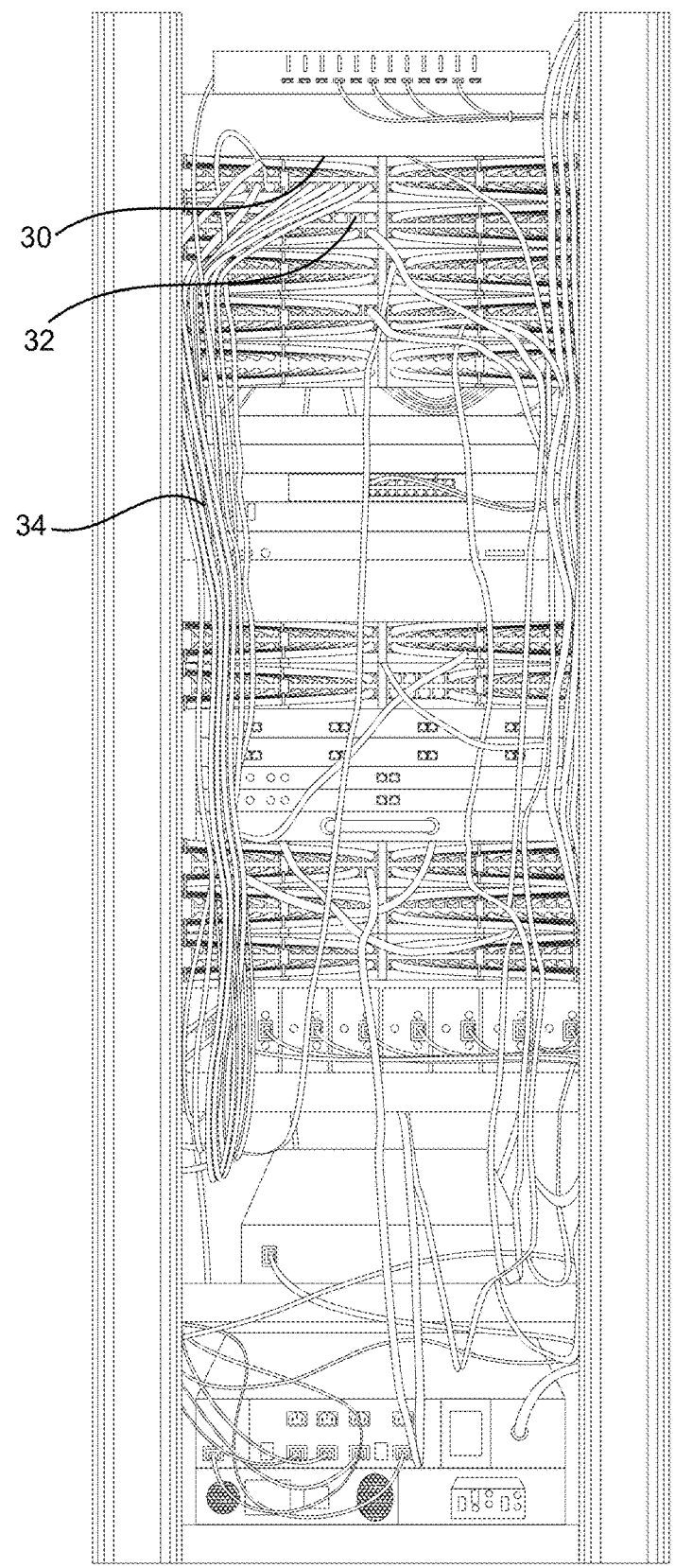
FIG. 3 is a diagram illustrating a back perspective view of the conventional rack structure of FIG. 1, filled with modules as shown in FIG. 2, where multiple fabric-facing cables are connected to backplanes of the network equipment of the NE.
Figure 4:
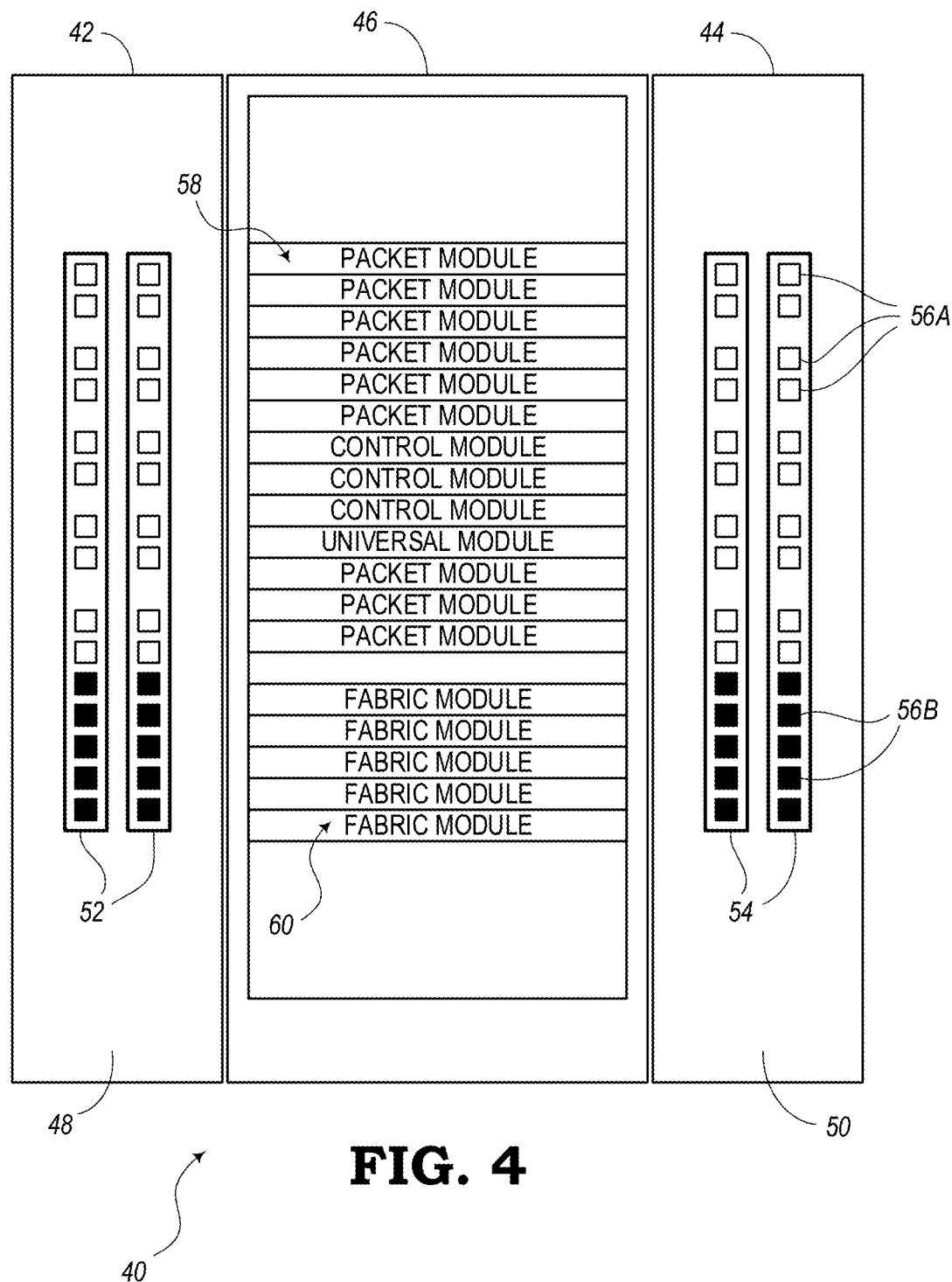
FIG. 4 is a diagram illustrating a front view of a cabinet structure including auxiliary side cabinets connected to a main rack structure, according to various embodiments of the present disclosure.

FIG. 4 shows a front view of an embodiment of a cabinet structure 40 according to various implementations of the present disclosure. In this embodiment, the cabinet structure 40 includes a first auxiliary side cabinet 42 and a second auxiliary side cabinet 44. According to other embodiments, the cabinet structure 40 may include just one auxiliary side cabinet. As shown in this embodiment, the auxiliary side cabinets 42, 44 are connected to a main rack structure 46, which may include any size, shape, etc. and may be designed similar to conventional racks. According to some embodiments, the main rack structure 46 may be the rack structure 10 shown in FIGS. 1-3. Thus, the present disclosure is configured to improve upon conventional rack structures by supplementing the rack structures with one or more auxiliar side cabinets (e.g., the first auxiliary side cabinet 42, the second auxiliary side cabinet 44, and/or other auxiliary side cabinets as described below with respect to other embodiments or as would be conceived by one of ordinary skill in the art having knowledge of the present disclosure).

Although only the front portions of the auxiliary side cabinets 42, 44 are shown in FIG. 4, it should be noted that the auxiliary side cabinets 42, 44 include a three-dimensional rectangular frame structure. In some embodiments, the auxiliary side cabinets 42, 44 may have the same or similar depth as the main rack structure 46 to which they are connected. In some embodiments, the auxiliary side cabinets 42, 44 may be configured as vertical cassettes having a metal frame of posts and beams and may include sheet metal.

The auxiliary side cabinets 42, 44 may be connected to the main rack structure 46 by any suitable means, such as physical hardware (e.g., nuts, bolts, screws, screw holes etc.), by welding metal frames together, etc. The auxiliary side cabinets 42, 44 may each include posts that may be connected to respective pairs of posts (e.g., posts 12, 14 on the left side or posts 16, 18 on the right side) and/or connected to the respective side panel 20, 22 of the main rack structure 46 (e.g., rack structure 10). Additionally and/or alternatively, the auxiliary side cabinets 42, 44 may include side panels positioned adjacent to the main rack structure 46, whereby the respective side panel of each auxiliary side cabinet 42, 44 may also or alternatively be connected to the posts 12, 14, 16, 18 and/or side panels 20, 22 of the main rack structure 46 (e.g., rack structure 10). The auxiliary side cabinets 42, 44 may sit on the ground next to the housing of the main rack structure 46.

Furthermore, the first auxiliary side cabinet 42 includes a first front surface 48 and the second auxiliary side cabinet 44 includes a second front surface 50. The front surfaces 48, 50 may include a panel or other structure comprising any suitable material (e.g., sheet metal, etc.). The first front surface 48 of the first auxiliary side cabinet 42 is configured to support one or more connector panels 52 arranged in any suitable manner on the first front surface 48. The second front surface 50 of the second auxiliary side cabinet 44 is configured to support one or more connector panels 54 arranged in any suitable manner on the second front surface 50. Although two connector panels 52, 54 are shown in FIG. 4 on each front surface, it should be noted that each auxiliary side cabinet may include any number of connector panels.

The cabinet structure 40 of FIG. 4 is further defined, whereby each connector panel 52, 54 arranged on the front surfaces 48, 50 may include any number of connectors 56. According to some embodiments, each connector panel 52, 54 may include thirteen connectors 56. For example, in some implementations, eight of the connectors 56 may be 40-link connectors 56A and five of the connectors 56 may be 64-link connectors 56B. The eight 40-link connectors 56A may be configured for coupling, via suitable cables, with various front-facing connectors associated with a first set of modules 58 (e.g., packet modules, control modules, universal modules, linecards, etc.) housed on the main rack structure 46. The five 64-link connectors 56B may be configured for coupling, via suitable cables, with various front-facing connectors associated with a second set of modules 60 (e.g., fabric modules, fabric linecards, etc.) housed on the main rack structure 46. The connectors 56A, 56B may be the same as or similar to connectors that normally would be mounted on a backplane (e.g., backplane 30) at the back of a conventional network rack system. Thus, the connectors 56A, 56B may be referred to as backplane-style connectors or high pin count connectors. Also, the front-facing connectors are described for illustration; these could also be rear-facing as well as combinations thereof.

Figure 5:
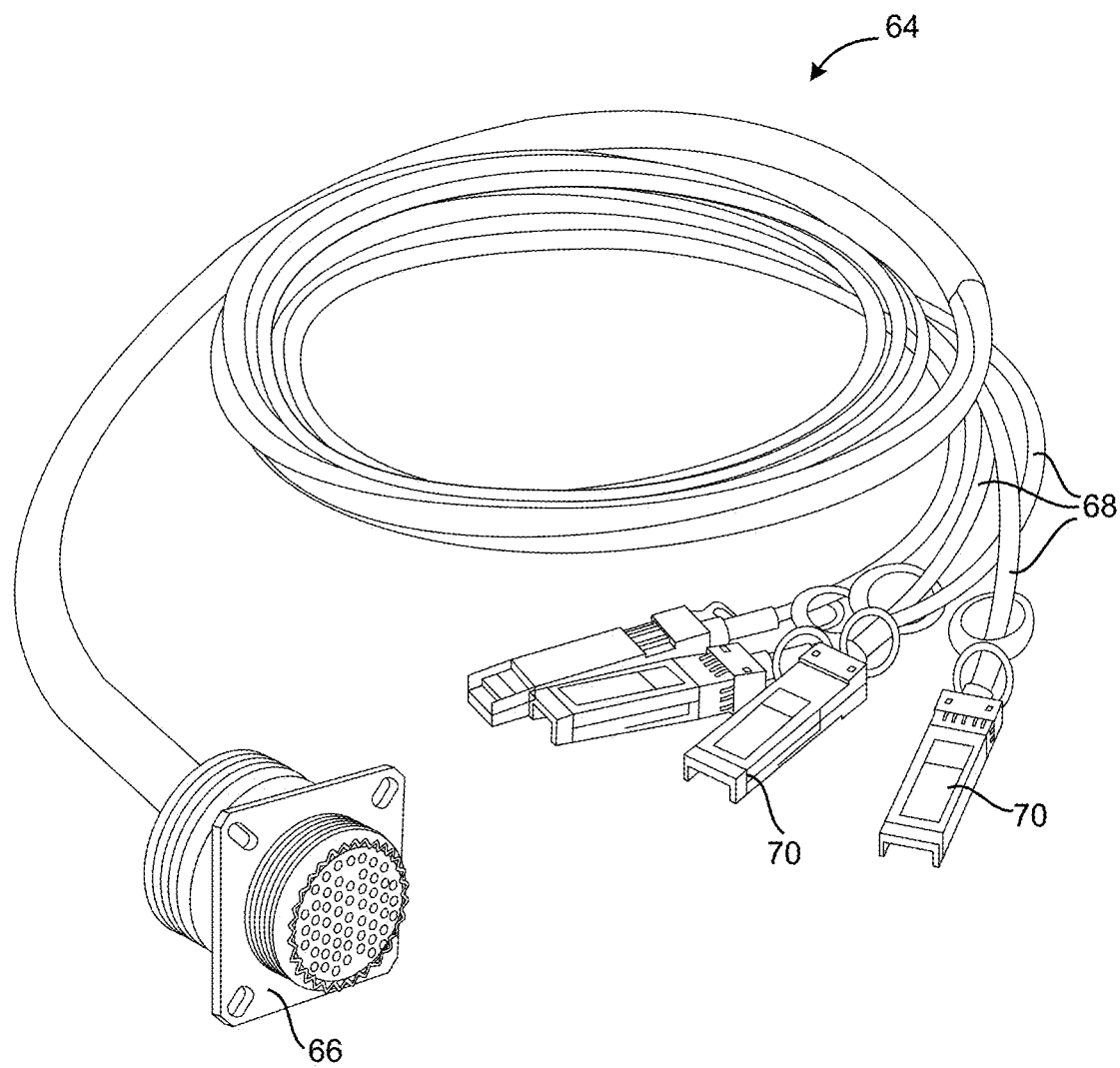
FIG. 5 is a diagram illustrating an octopus cable that can be used for propagating signals between a connector located on a front panel of one of the auxiliary side cabinets shown in FIG. 4 and one or more connectors on a front surface of the modules of the NE on the main rack structure, according to various embodiments.

According to some embodiments, the connector panels 52, 54 may be configured to have the same or different arrangements of connectors 56 thereof. In some embodiments, the connectors 56 may be arranged in a vertical column on the connector panels 52, 54, or, in alternative embodiments, may be arranged in other patterns. For example, as shown in FIG. 5, the connectors 56 are arranged vertically, where each connector panel 52, 54 in this embodiment includes eight 40-link connectors 56A arranged in pairs and five 64-line connectors 56B grouped together with the bottom pair of 40-link connectors 56A. Thus, in this embodiment, a first pair of 40-link connectors 56A may be positioned at the top of the connector panels 52, 54, with a second pair of 40-link connectors 56A below that, followed by a third pair, and then following by a group of seven connectors 56 including the last pair of 40-link connectors 56A and the five 64-link connectors 56B. The positioning of the thirteen connectors 56 on the connector panels 52, 54 in this example may be referred to as having a 2-2-2-7 arrangement.

Each auxiliary side cabinet 42, 44 may also include internal wiring or cabling for connecting the connectors 56A, 56B to additional connectors (not shown in FIG. 4). For example, the additional connectors may be arranged on a back section of the respective auxiliary side cabinet 42, 44 and may be configured for connection to additional cabling, such as fabric-facing cables. The internal cabling is described in more detail below with respect to FIGS. 16-22.

FIG. 5 is a diagram illustrating an octopus cable 64 that can be used for propagating signals connectors of the auxiliary side cabinets 42, 44 and connectors 56 of the modules 58, 60 shown in FIG. 4. For example, the octopus cable 64 may be configured to be coupled between a connector 56 (e.g., one of the 40-link connectors 56A or 64-link connectors 56B) located on the front panel 48, 50 of one of the auxiliary side cabinets 42, 44 and one or more connectors on a front surface of the modules 58, 60 of the NE on the main rack structure 46.

The octopus cable 64 may include a bulkhead connector 66 configured with any suitable number of parallel links. For example, the bulkhead connector 66 may be configured with 40 links, 64 links, or any other number of links. The bulkhead connector 66 may be configured as a backplane-style connector for connection with the backplane-style connectors 56 of the auxiliary side cabinets 42, 44. Extending from the bulkhead connector 66 of the octopus cable 64 are multiple legs 68. In some embodiments, the octopus cable 64 may include five legs, eight legs, or any other suitable number of legs 68. The end of each leg 68 includes a connector 70 (e.g., QSFP-DD connector, such as for eight parallel links). The connectors 70 are configured to plug directly into corresponding connectors (not shown) on the modules 58, 60.

In some embodiments, the octopus cable 64 may include a 40-link bulkhead connector 66, five legs 68, and an eight-link QSFP-DD connector 70 at the end of each leg 68. This type of 40-link octopus cable 64 may be used with the modules 58 (e.g., packet modules, control modules, universal modules, etc.) shown in FIG. 4. In some other embodiments, the octopus cable 64 may include a 64-link bulkhead connector 66, eight legs 68, and an eight-link QSFP-DD connector 70 at the end of each leg 68. This type of 64-link octopus cable 64 may be used with the modules 60 (e.g., fabric modules) shown in FIG. 4. By keeping the QSFP-DD interfaces positioned with the respective modules 58, 60, Active Optical Cables (ADCs) can still be used where desired and allows the cabinet structure 40 and octopus cable 64 to be used with known rack structures and NEs.

Figure 6:
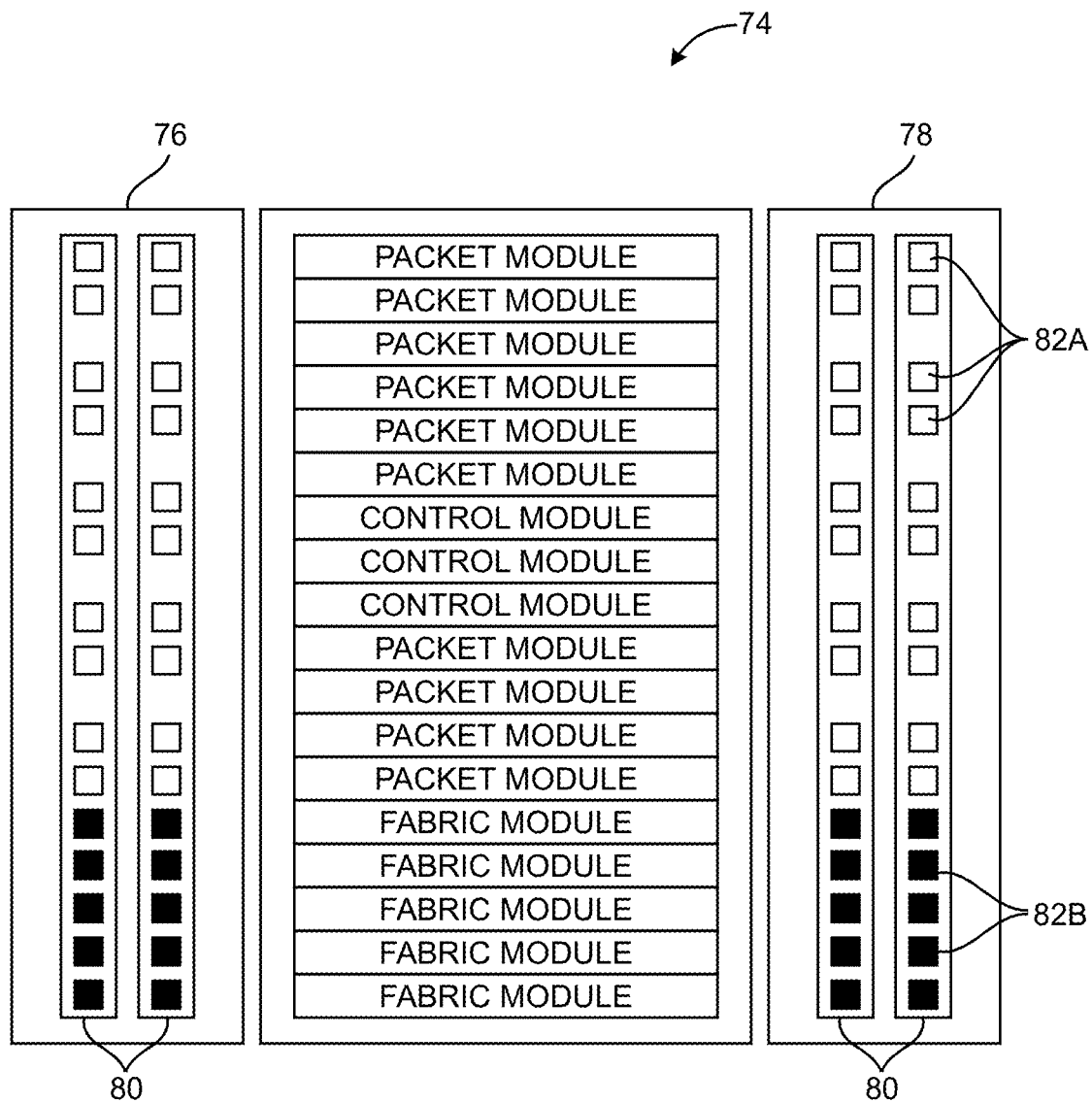
FIG. 6 is a diagram illustrating a first arrangement of connector panels on auxiliary side cabinets, according to various embodiments.

FIGS. 6-15 show additional implementations of cabinet structures having auxiliary side cabinets. For example, FIG. 6 shows an embodiment of a cabinet structure 74 having two auxiliary side cabinets 76, 78. Each auxiliary side cabinet 76, 78 includes two vertically-oriented connector panels 80 in this embodiment, where each connector panel 80 includes thirteen connectors 82A, 82B (e.g., eight 40-link connectors 82A and five 64-link connectors 82B) grouped with the 2-2-2-7 arrangement in a column of the respective connector panel 80. The two connector panels 80 on each auxiliary side cabinet 76, 78 are arranged side-by-side in a right-side-up orientation (i.e., the 2-2-2-7 arrangement from top to bottom). The auxiliary side cabinets 76, 78 may be physically connected to a main rack structure. The main rack structure may be configured to support a first set of modules (e.g., packet modules, switch modules, power modules, control modules, timing modules, immersion modules, universal modules, etc.) configured for communication with the connectors 82A via suitable cables (e.g., octopus cable 64) and a second set of modules (e.g., fabric modules, etc.) configured for communication with the connectors 82B via suitable cables (e.g., octopus cable 64). In this embodiment, the cabinet structure 74 may have a height that may be referred to as a "half-rack" having 48 Rack Units (RUs). The first set of modules may take a 25% hit upon the upgrade to the cabinet structure 74.

Figure 7:
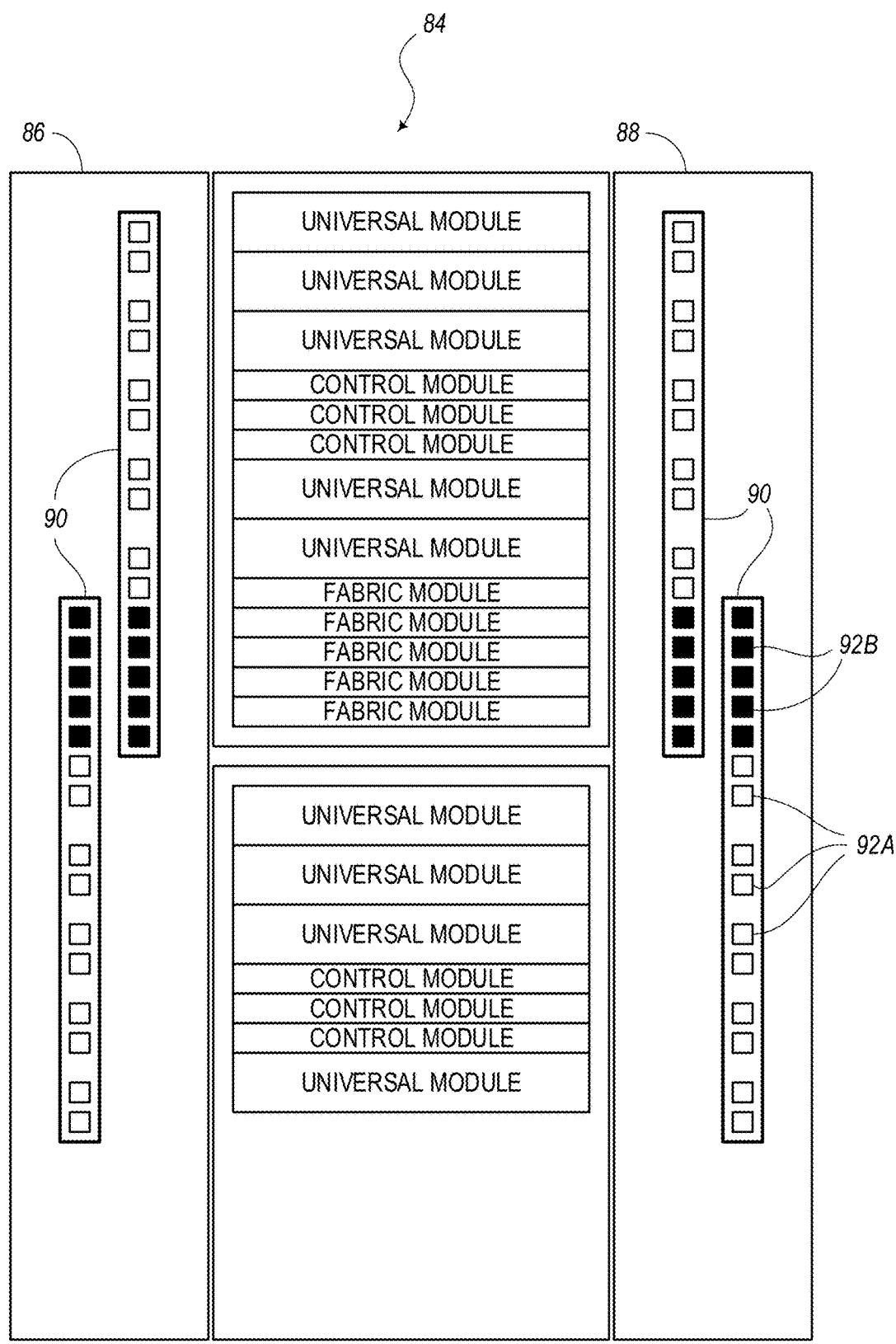
FIG. 7 is a diagram illustrating a second arrangement of connector panels on auxiliary side cabinets, according to various embodiments.

FIG. 7 is a diagram showing another embodiment of a cabinet structure 84 having two auxiliary side cabinets 86, 88. Each auxiliary side cabinet 86, 88 includes two vertically-oriented connector panels 90 in this embodiment, where each connector panel 90 includes thirteen connectors 92A, 92B (e.g., eight 40-link connectors 92A and five 64-link connectors 92B) grouped with the 2-2-2-7 arrangement in a column of the respective connector panel 90. However, in this embodiment, the two connector panels 90 on each auxiliary side cabinet 86, 88 are arranged in an offset manner with one connector panel 90 higher than the other. Also, one of the connector panels 90 is arranged in a right-side-up orientation (i.e., the 2-2-2-7 arrangement from top to bottom) while the other connector panel 90 is arranged in an upside-down orientation (i.e., the 2-2-2-7 arrangement from bottom to top). The auxiliary side cabinets 86, 88 may be physically connected to a main rack structure. The main rack structure may be configured to support a first set of modules (e.g., packet modules, switch modules, power modules, control modules, timing modules, immersion modules, universal modules, etc.) configured for communication with the connectors 92A via suitable cables (e.g., octopus cable 64) and a second set of modules (e.g., fabric modules, etc.) configured for communication with the connectors 92B via suitable cables (e.g., octopus cable 64). In this embodiment, the cabinet structure 84 may have a height that may be referred to as a "full-rack" having two sets of 48 Rack Units (RUs). The first set of modules may take a 50% hit upon the upgrade to the cabinet structure 84.

Figure 8:
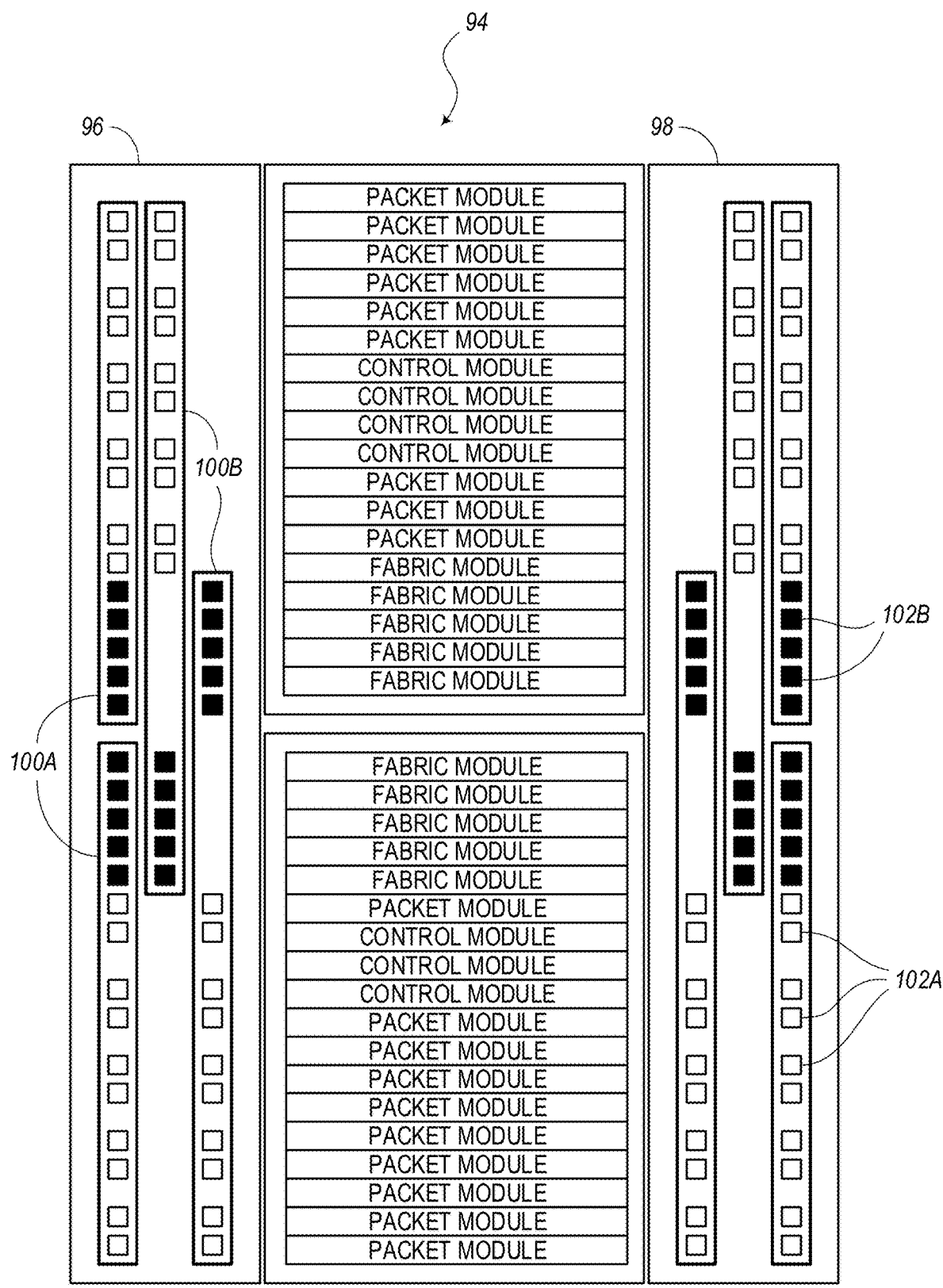
FIG. 8 is a diagram illustrating an arrangement of different types of connector panels on auxiliary side cabinets, according to various embodiments.

FIG. 8 is a diagram showing another embodiment of a cabinet structure 94 having two auxiliary side cabinets 96, 98. Each auxiliary side cabinet 96, 98 includes four vertically-oriented connector panels 100 in this embodiment. Each connector panel 100 includes thirteen connectors 102A, 102B (e.g., eight 40-link connectors 102A and five 64-link connectors 102B). The connectors 102 on the two connector panels 100A are oriented with a 2-2-2-7 arrangement in a column of the respective connector panel 100. The connectors 102 on the two connector panels 100B are oriented with a 2-2-2-2-5 arrangement in a column, where the five 64-link connectors 102B are arranged at one end and the eight 40-link connectors 102A are arranged in groups starting from the other end. In this embodiment, the four connector panels 100 on each auxiliary side cabinet 96, 98 are arranged in three columns in an offset manner with the 64-link connectors 102B positioned near the fabric modules supported near the center of the main rack. Also, two of the connector panels 100 are arranged in a right-side-up orientation (i.e., the 2-2-2-7 arrangement or 2-2-2-2-5 arrangement from top to bottom) while the other two connector panels 100 are arranged in an upside-down orientation (i.e., the 2-2-2-7 arrangement or 2-2-2-2-5 arrangement from bottom to top). The auxiliary side cabinets 96, 98 may be physically connected to the main rack structure. The main rack structure may be configured to support a first set of modules (e.g., packet modules, control modules, universal modules, etc.) configured for communication with the connectors 102A via suitable cables (e.g., octopus cable 64) and a second set of modules (e.g., fabric modules, etc.) configured for communication with the connectors 102B via suitable cables (e.g., octopus cable 64). In this embodiment, the cabinet structure 94 may have a height of 96 RU, or referred to as having a 96T full-rack.

Figure 9:
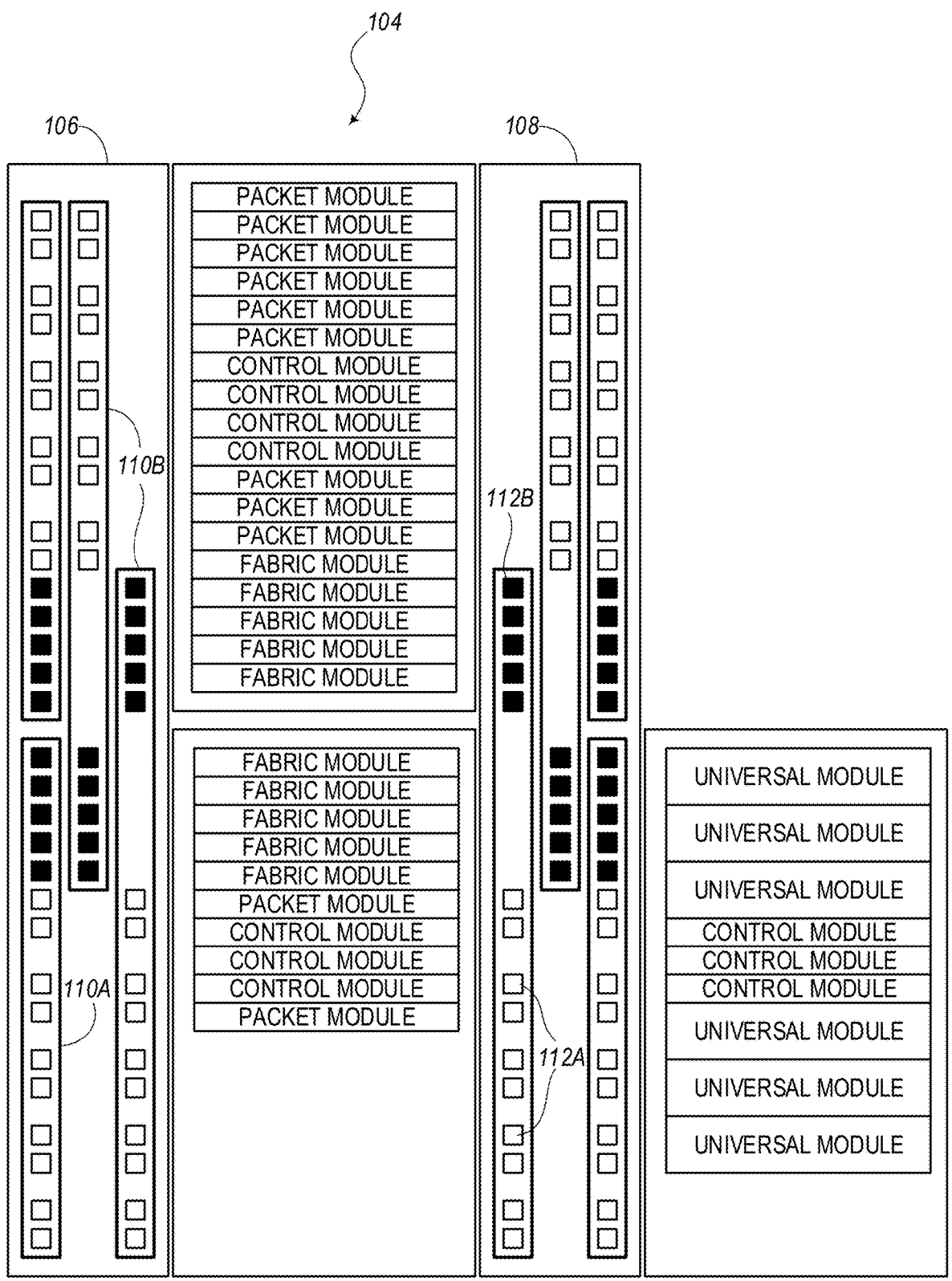
FIG. 9 is a diagram illustrating another arrangement of different types of connector panels on auxiliary side cabinets for use with two main rack structures, according to various embodiments.

FIG. 9 is a diagram showing another embodiment of a cabinet structure 104 having two auxiliary side cabinets 106, 108. Each auxiliary side cabinet 106, 108 includes four vertically-oriented connector panels 110 in this embodiment. Each connector panel 110 includes thirteen connectors 112A, 112B (e.g., eight 40-link connectors 112A and five 64-link connectors 112B). The connectors 112 on the two connector panels 110A are oriented with a 2-2-2-7 arrangement in a column of the respective connector panel 110A. The connectors 102 on the two connector panels 1106 are oriented with a 2-2-2-2-5 arrangement in a column, where the five 64-link connectors 112B are arranged at one end and the eight 40-link connectors 112A are arranged in groups starting from the other end. In this embodiment, the four connector panels 110 on each auxiliary side cabinet 106, 108 are arranged in three columns in an offset manner with the 64-link connectors 112B positioned near the fabric modules supported near the center of the main rack. Also, two of the connector panels 110 are arranged in a right-side-up orientation (i.e., the 2-2-2-7 arrangement or 2-2-2-2-5 arrangement from top to bottom) while the other two connector panels 110 are arranged in an upside-down orientation (i.e., the 2-2-2-7 arrangement or 2-2-2-2-5 arrangement from bottom to top). The auxiliary side cabinets 106, 108 may be physically connected to the main rack structure. Also, the second auxiliary side cabinet 108 is further configured to be physically connected to another rack structure, such as a half-rack frame. The main rack structure and second rack structure may be configured to support first sets of modules (e.g., packet modules, control modules, universal modules, etc.) configured for communication with the connectors 112A via suitable cables (e.g., octopus cable 64). The extra rack in this embodiment may not necessary include any fabric module, whereby only the main rack structure include a second set of modules (e.g., fabric modules, etc.) configured for communication with the connectors 112B via suitable cables (e.g., octopus cable 64). In this embodiment, the cabinet structure 104 may have a height of 96 RU with respect to the main rack structure and may be a two rack system.

Figure 10:
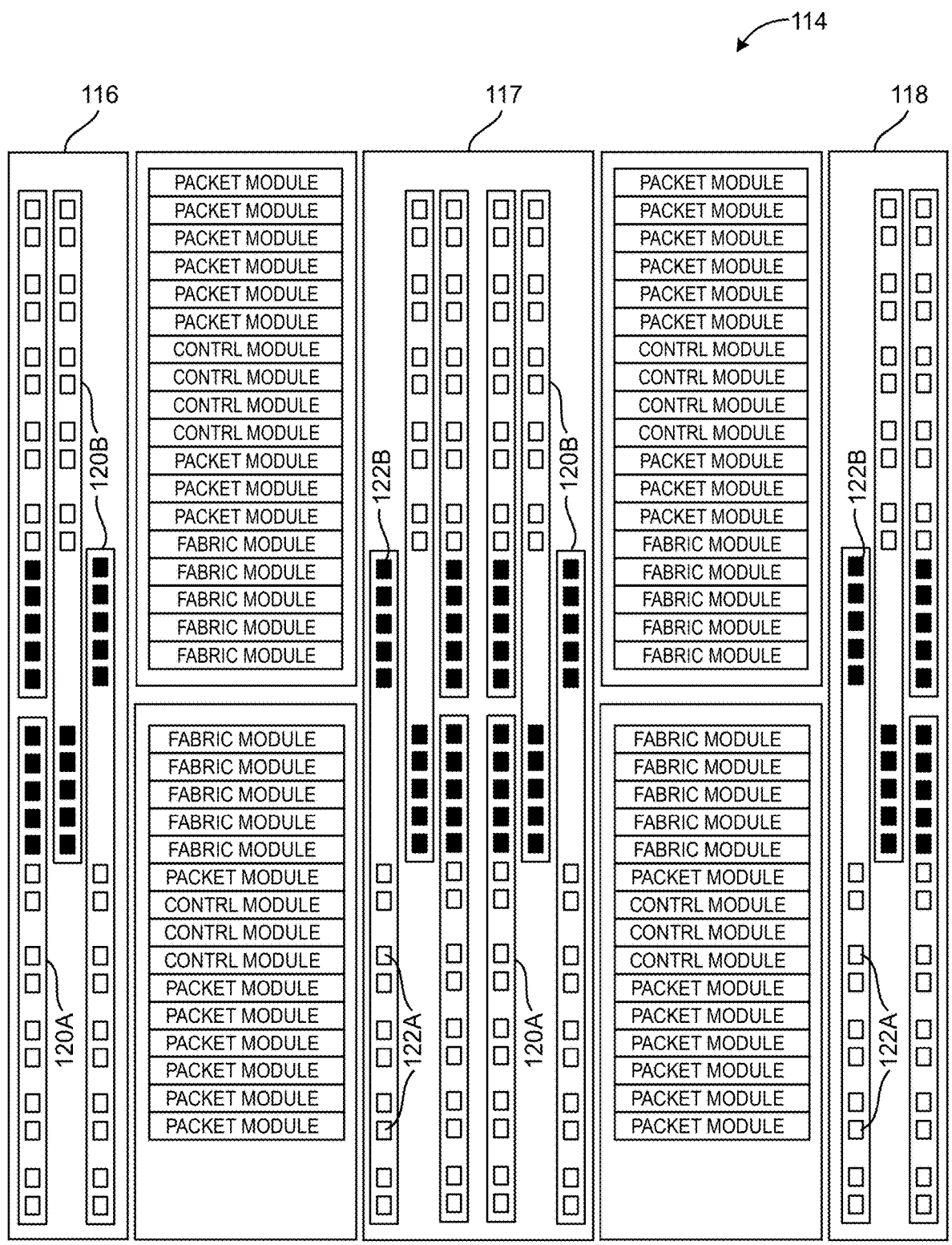
FIG. 10 is a diagram illustrating an arrangement of different types of connector panels on three auxiliary side cabinets for use with two main rack structures, according to various embodiments.

FIG. 10 is a diagram showing another embodiment of a cabinet structure 114 having three auxiliary side cabinets 116, 117, 118. Each of the auxiliary side cabinets 116, 118 includes four vertically-oriented connector panels 120A, 120B. In this embodiment, the middle auxiliary side cabinet 117 includes eight vertically-oriented connector panels 120A, 120B. Each connector panel 120 includes thirteen connectors 122A, 122B (e.g., eight 40-link connectors 122A and five 64-link connectors 122B) oriented with a 2-2-2-7 arrangement or 2-2-2-2-5 arrangement either right-side-up or upside down. The auxiliary side cabinets 116, 117 may be physically connected to a first main rack structure. The auxiliary side cabinets 117, 118 may be physically connected to a second main rack structure. The two main rack structures may be configured to support first sets of modules (e.g., packet modules, control modules, universal modules, etc.) configured for communication with the connectors 122A and a second set of modules (e.g., fabric modules, etc.) configured for communication with the connectors 122B. In this embodiment, the cabinet structure 114 may be a 192T dual-rack system.

Figure 11:
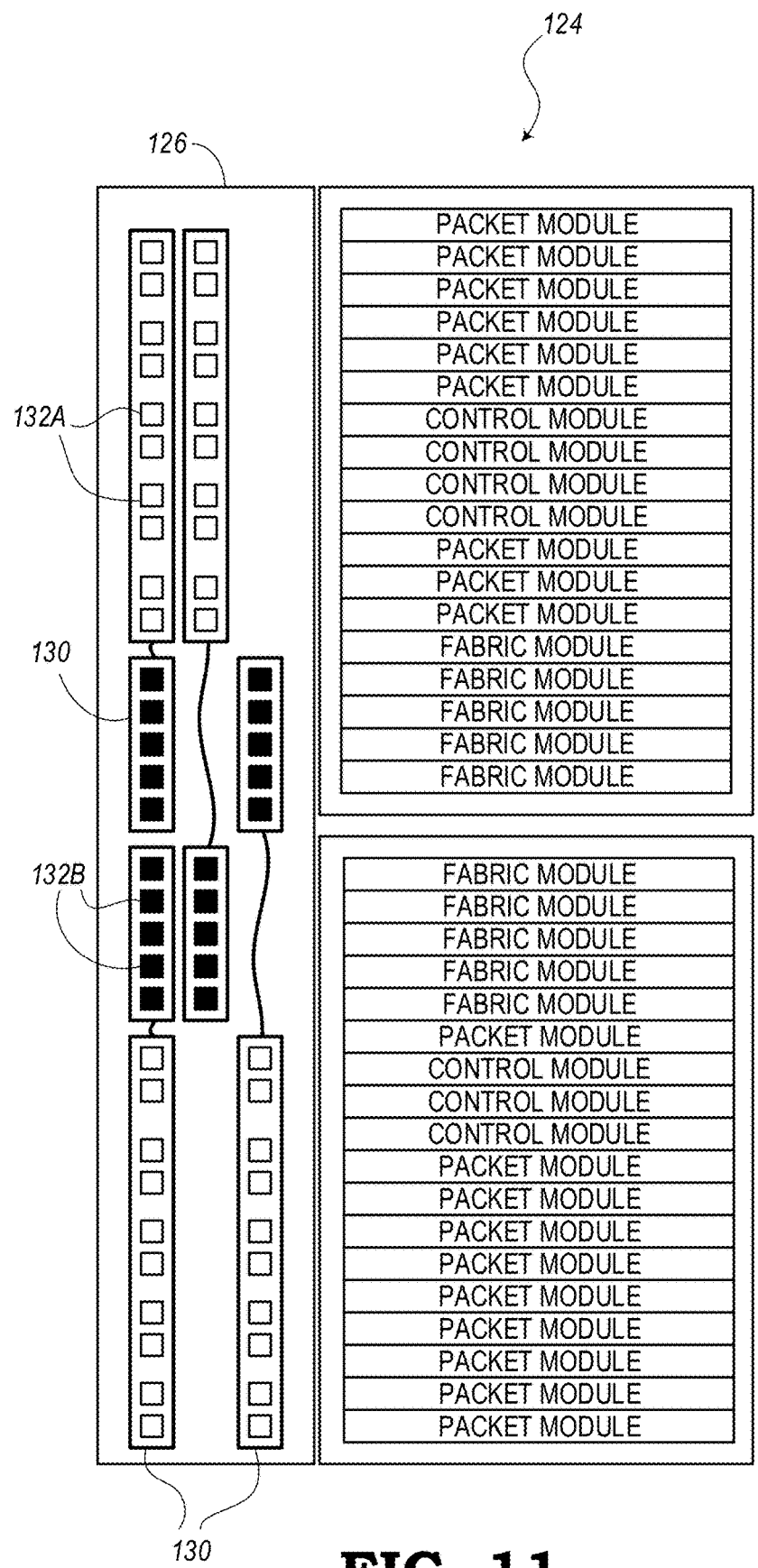
FIG. 11 is a diagram illustrating an arrangement of sectional connector panels on a single auxiliary side cabinet, according to various embodiments.

FIG. 11 is a diagram showing another embodiment of a cabinet structure 124 having a single auxiliary side cabinet 126. The auxiliary side cabinet 126 includes sectional connector panels 130 having thirteen connectors 132A, 132B (e.g., eight 40-link connectors 132A and five 64-link connectors 132B). A first section of each sectional connector panel 130 is configured to support the eight connectors 132A and the second section of each sectional connector panel 130 is configured to support the five connectors 1326. The two sections of each connector panel 130 may be separated from each other at any suitable distance. The first section includes the connectors 132A grouped in pairs, while the second section includes the connectors 132B grouped together. The sectional connector panels 130 may be vertically oriented and may be arranged in a right-side-up orientation or an upside-down orientation. The auxiliary side cabinet 126 may be physically connected to a main rack structure. The main rack structure may be configured to support a first set of modules (e.g., packet modules, control modules, universal modules, etc.) configured for communication with the connectors 132A via suitable cables and a second set of modules (e.g., fabric modules, etc.) configured for communication with the connectors 132B via suitable cables. In this embodiment, the cabinet structure 124 may be a 96T full-rack system.

Figure 12:
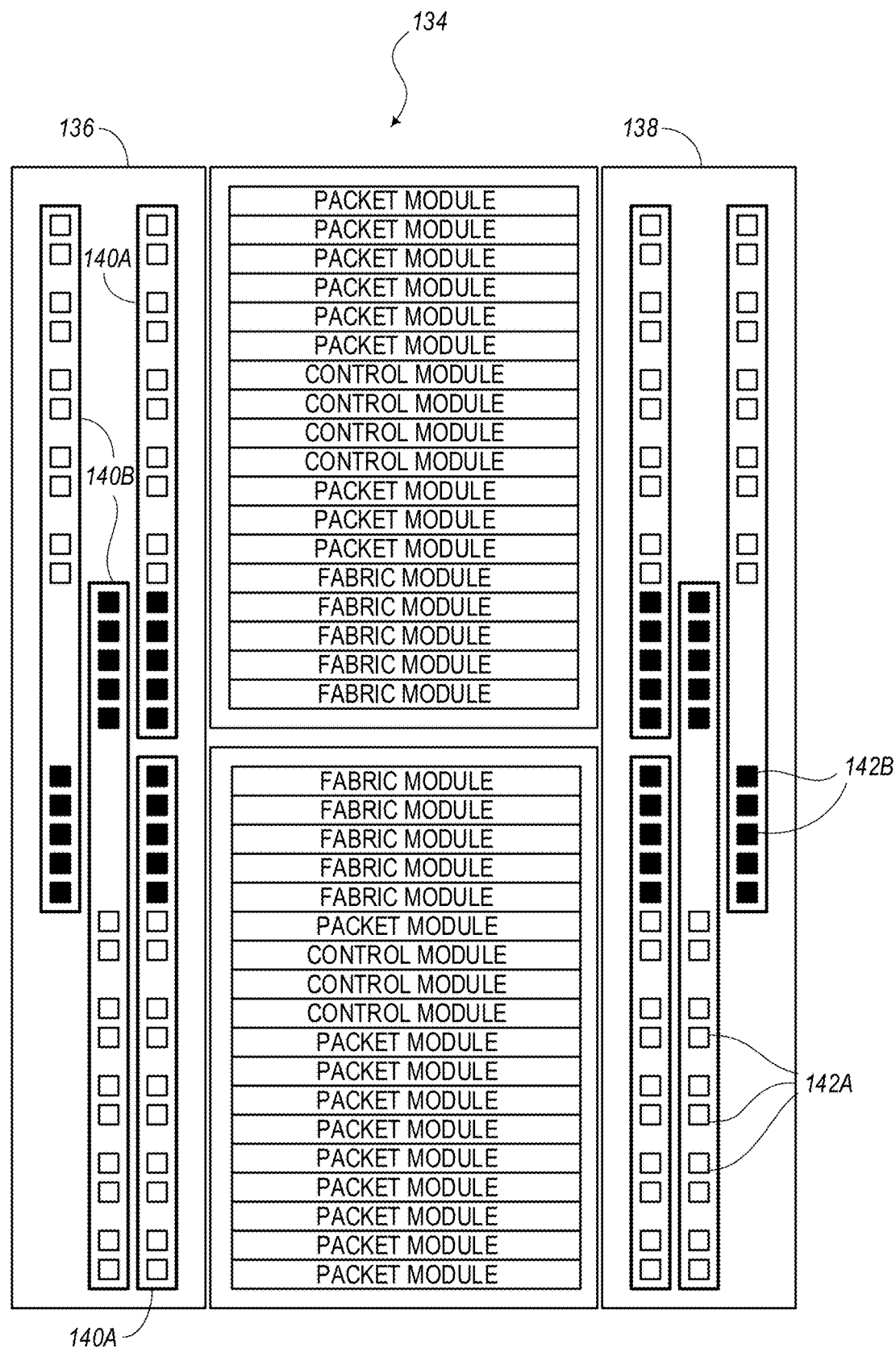
FIG. 12 is a diagram illustrating an arrangement of different types of connector panels on auxiliary side cabinets, according to various embodiments.

FIG. 12 is a diagram showing another embodiment of a cabinet structure 134 having two auxiliary side cabinets 136, 138. Each auxiliary side cabinet 136, 138 includes vertically-oriented connector panels 140, where each connector panel 140 includes thirteen connectors 142A, 142B (e.g., eight 40-link connectors 142A and five 64-link connectors 142B) grouped with the 2-2-2-7 or 2-2-2-2-5 arrangement in a column of the respective connector panel 140, either right-side-up or upside-down. In this embodiment, the connectors 142 may be configured as electrical connectors for transmission of electrical signals over electrical cables. The auxiliary side cabinets 136, 138 may be physically connected to a main rack structure, which may be configured to support a first set of modules (e.g., packet modules, control modules, universal modules, etc.) configured for communication with the connectors 142A and a second set of modules (e.g., fabric modules, etc.) configured for communication with the connectors 142B. In this embodiment, the cabinet structure 134 may be a 96T two-rack system where the connectors 142 of the auxiliary side cabinets 136, 138 may be configured for connection to remote modules supported on rack systems physically separated from the cabinet structure 134.

Figure 13:
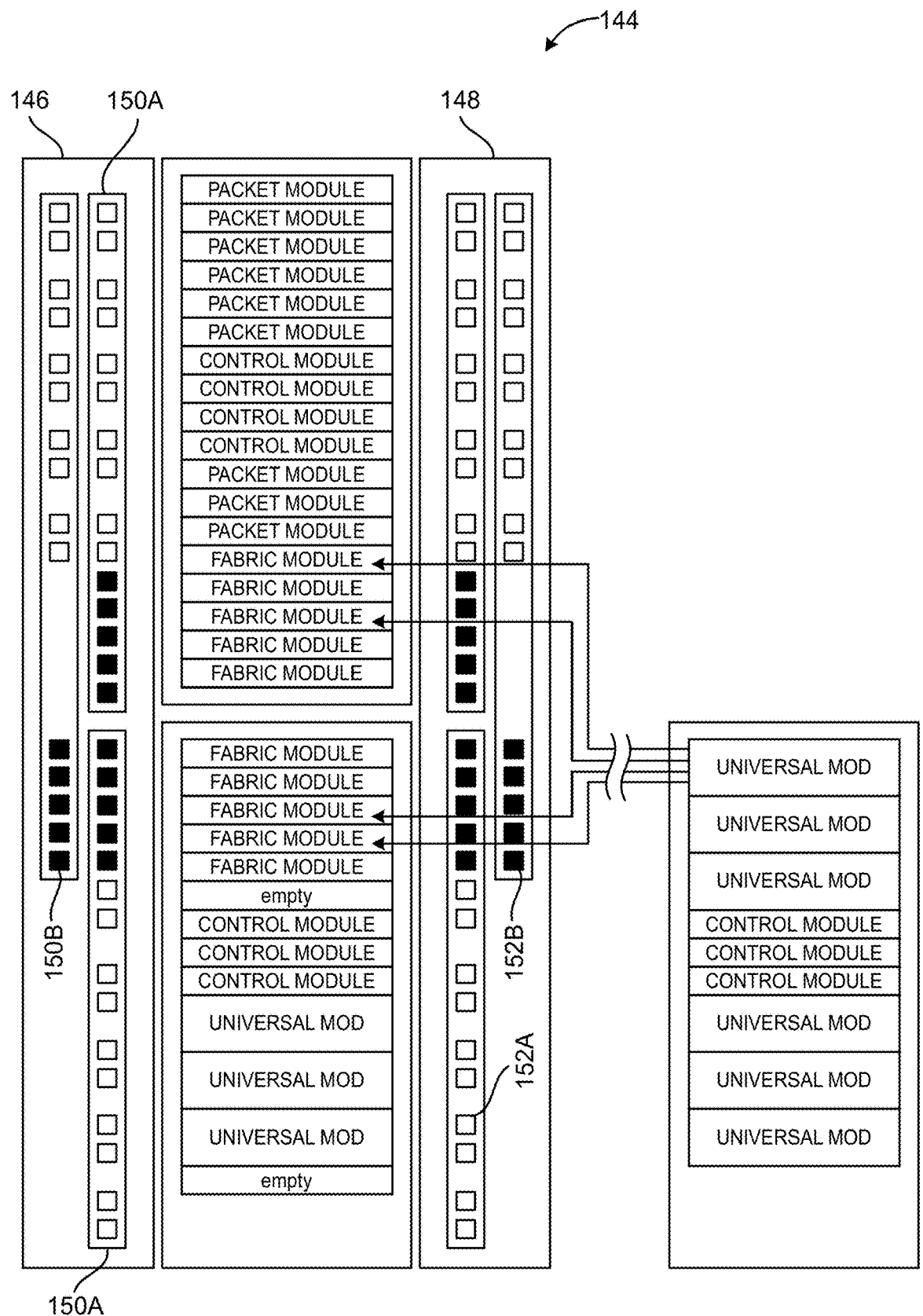
FIG. 13 is a diagram illustrating an application of a system having auxiliary side cabinets where signals are propagated directly from the modules of the NE on the main rack structure to fabric modules of a different NE, according to various embodiments.

FIG. 13 is a diagram showing another embodiment of a cabinet structure 144 having two auxiliary side cabinets 146, 148. Each auxiliary side cabinet 146, 148 includes vertically-oriented connector panels 150, where each connector panel 150 includes thirteen connectors 152A, 152B (e.g., eight 40-link connectors 152A and five 64-link connectors 152B) grouped with the 2-2-2-7 or 2-2-2-2-5 arrangement in column of the respective connector panel 150, either right-side-up or upside-down. In this embodiment, the connectors 152 may be configured as electrical connectors for transmission of electrical signals over electrical cables. The auxiliary side cabinets 146, 148 may be physically connected to a main rack structure, which may be configured to support a first set of modules (e.g., packet modules, control modules, universal modules, etc.) configured for communication with the connectors 152A and a second set of modules (e.g., fabric modules, etc.) configured for communication with the connectors 152B. In this embodiment, the cabinet structure 144 may be a 96T two-rack system where the connectors 152 of the auxiliary side cabinets 146, 148 may be configured for connection to modules supported on a rack system via direct QSFP-DD Active Electrical Cables (AECs), Active Optical Cables (AOCs), and/or Direct Attached Cables (DACs) to fabric modules on another system outside of the cabinet structure 144.

Figure 14:
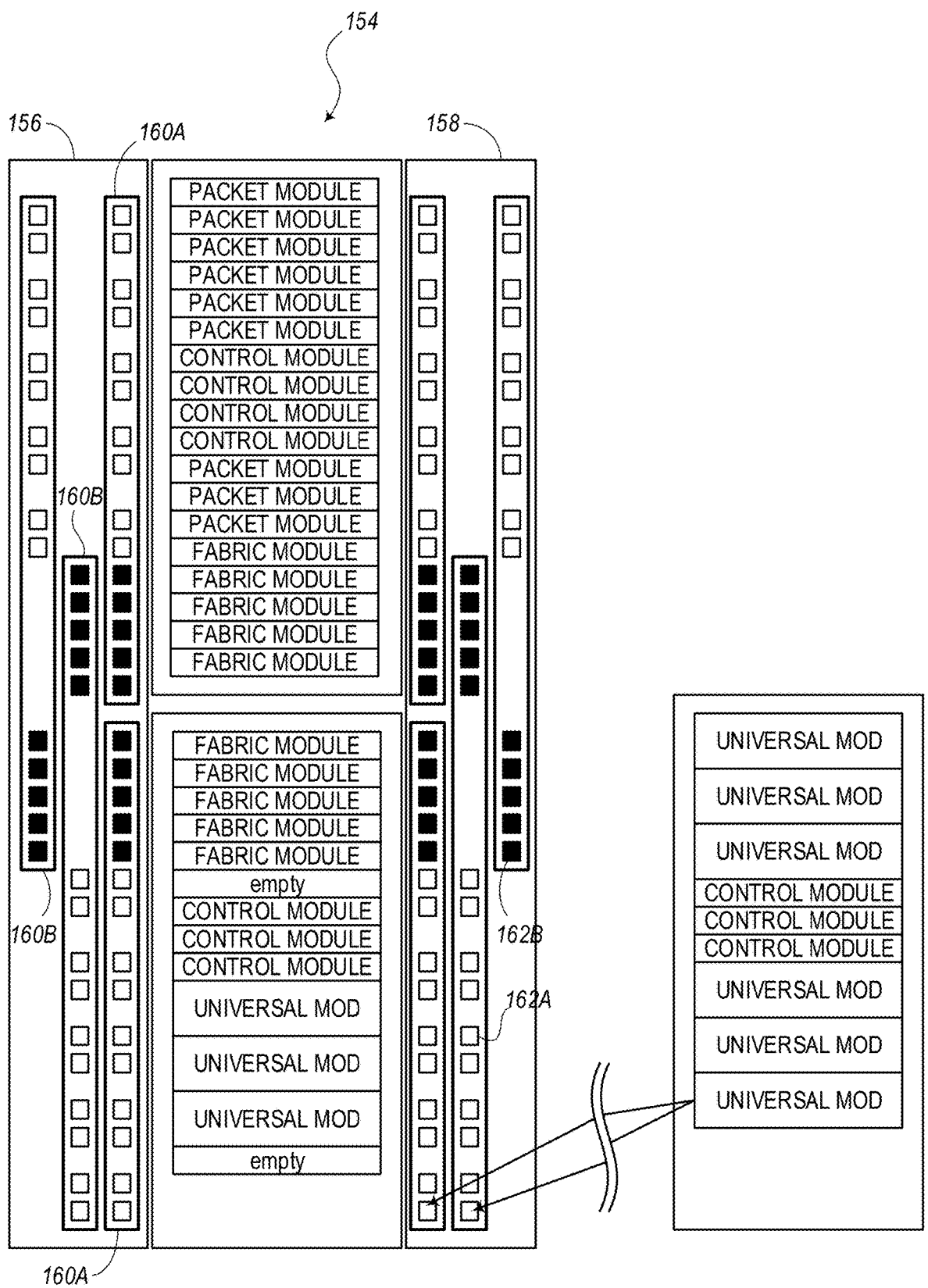
FIG. 14 is a diagram illustrating a first arrangement of connector panels on auxiliary side cabinets where connectors of the connector panels are optical connectors that may be connected to modules on the main rack structure of modules of other NEs, according to various embodiments.

FIG. 14 is a diagram showing an embodiment of a cabinet structure 154 having an arrangement of connector panels on auxiliary side cabinets where connectors of the connector panels are optical connectors that may be connected to modules on the main rack structure of modules of other NEs. The cabinet structure 154 has two auxiliary side cabinets 156, 158. Each auxiliary side cabinet 156, 158 includes vertically-oriented connector panels 160, where each connector panel 160 includes thirteen connectors 162A, 162B (e.g., eight 40-link connectors 162A and five 64-link connectors 162B) grouped with the 2-2-2-7 or 2-2-2-2-5 arrangement in columns of the respective connector panel 160, either right-side-up or upside-down. In this embodiment, the connectors 162 may be configured as optical connectors for transmission of optical signals over optical cables. The auxiliary side cabinets 156, 158 may be physically connected to a main rack structure, which may be configured to support a first set of modules (e.g., packet modules, control modules, universal modules, etc.) configured for communication with the connectors 162A and a second set of modules (e.g., fabric modules, etc.) configured for communication with the connectors 162B. In this embodiment, the cabinet structure 154 may be a 96T two-rack system where the connectors 162 of the auxiliary side cabinets 156, 158 may be configured for connection to modules supported on a rack system via direct QSFP-DD AOCs to fabric modules on another system outside of the cabinet structure 154.

In the embodiment of FIG. 14, the cabinet structure 154 may configured as a sideplane device or optical shuffle cassette device. The connectors 162 may be optical Multi-fiber Push-On (MPO) connector. In one example, the MPO connector may include 80 fibers for 40 bi-directional links. An immersion module on the main rack structure may be coupled to connectors 162 via a QSFP-DD octopus cable (e.g., octopus cable 64). The cabinet structure 154 can provide additional power help if there are distributed housings. This may help when there may be cabling issues, such as thermal concentration issues.

Figure 15:
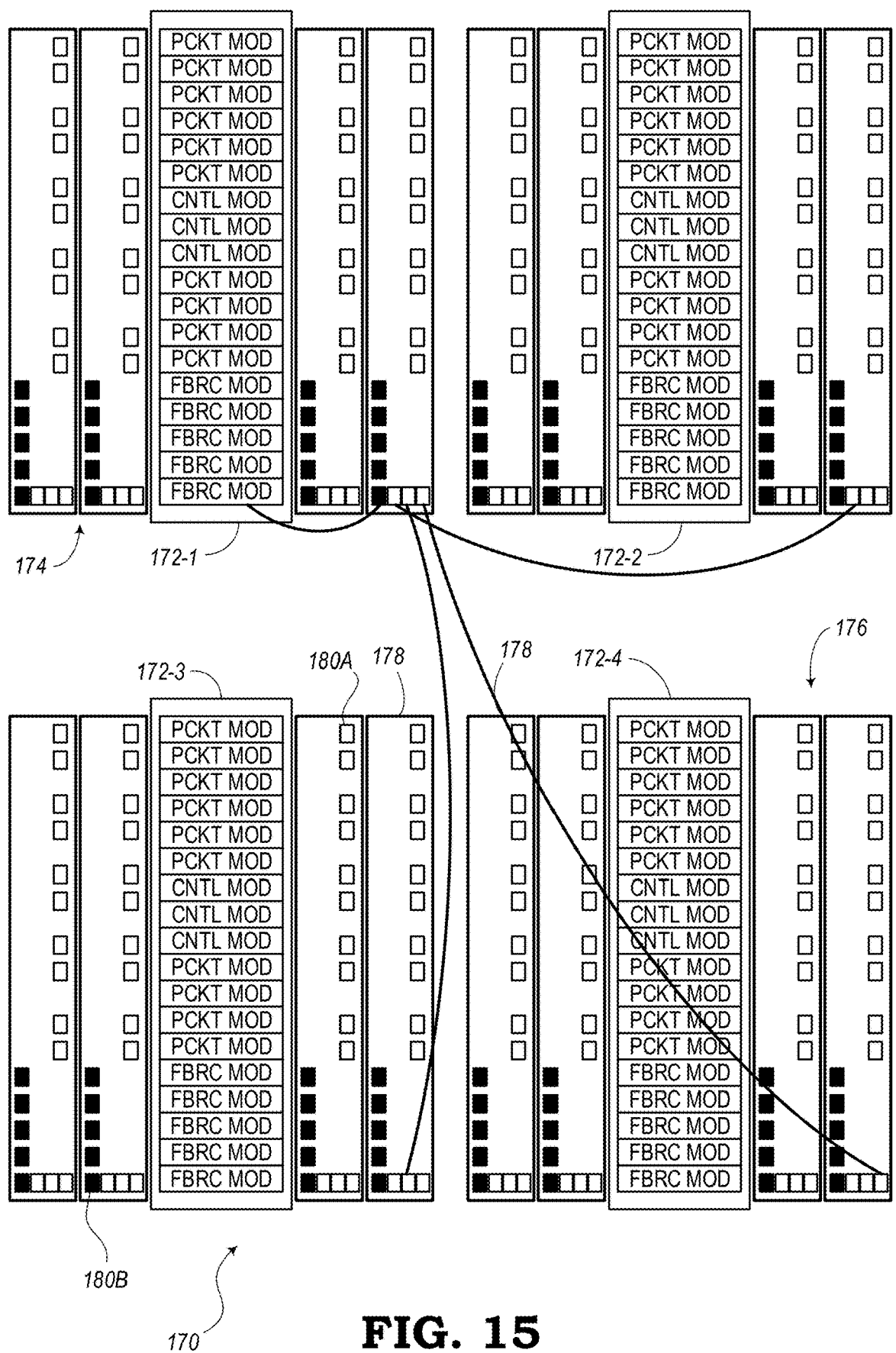
FIG. 15 is a diagram illustrating a data center with multiple main rack structures and multiple auxiliary cabinet structures where connectors from one auxiliary cabinet structure is configured to be connected to one or more connectors of other auxiliary cabinet structures, according to various embodiments.

FIG. 15 is a diagram illustrating a data center 170 having multiple rack structures 172-1, 172-2, 172-3, 172-4. In this embodiment, the data center 170 includes four rack structures 172, but in other embodiments, the data center 170 may include any number of rack structures 172 for physically supporting various modules, including a first set of modules (e.g., packet modules, switch modules, power modules, control modules, timing modules, immersion modules, universal modules, etc.) and a second set of modules (e.g., fabric modules, etc.). The rack structures 172-1, 172-2, 172-3, 172-4 include a first side auxiliary cabinet 174-1, 174-2, 174-3, 174-4, respectively, and a second side auxiliary cabinet 176-1, 176-2, 176-3, 176-4, respectively.

In this embodiment, each cabinet 174, 176 is configured to support two connector panels 178, which may have similar arrangements. For example, each connector panel 178 may include a total of thirteen optical connectors 180A, 180B, where eight (four pairs) may be configured as 40-link optical connectors 180A and five may be configured as 64-link optical connectors 180B. In this embodiment, the eight 40-link optical connectors 180A are arranged in one column and the five 64-link optical connectors 180B are arranged in another column. The multiple auxiliary cabinets 174, 178 are configured with optical connectors 180 where direct communication is possible, via suitable optical cables and connectors, from one auxiliary cabinet 174, 176 to one or more connectors of another auxiliary cabinet 174, 176 of the same or different rack structures 172-1, 172-2, 172-3, 172-4.

In one example use-case, a network operator may wish to separate all four housings or rack structures 172 by a certain distance (e.g., 48 meters) in order to distribute thermal load in the room. In another example use-case, the network operator may wish to reduce blast radius, since fabric modules do not necessarily need to be arranged together.

Therefore, according to various embodiments of the present disclosure, a single auxiliary cabinet (or sideplane cassette device) may have different sizes (e.g., 48T, 96T, 192T). In some cases, this may include some loopback MPO connectors. Also, for universal modules, it may not be necessary to flip the auxiliary cabinet upside down, since the fiber patch cords can easily be long enough to route to any module on the main rack structure.

Some advantages of the present embodiments include compatibility with regular modules, while not precluding existing QSFP-DD cabling schemes. Also, there may be an increase in density and take up less horizontal space on a rack. The present embodiments also allow for simpler operation and easier installation with fewer errors.

In addition, the embodiments of the present disclosure may be configured to simplify fabric upgrade, which may result in a 25% bandwidth hit at a time. Also, with these embodiments, the auxiliary cabinets may be configured such that they can be removed from the rear. Also, it may be possible to reduce the amount of cable length needed for interconnecting equipment in a system. In one case, a fabric module may be configured for connection with eight QSFP-DD connectors to a single panel connector and other interface modules may be configured for connection with five QSFP-DD connectors to a single panel connector. The present disclosure also enable support of 28AWG twinaxial ("twinax") connectors in the auxiliary cabinets to negate any impact of extra connectors.

By adding the extra auxiliary cabinet for simplifying cabling management, a higher cost may be incurred, but may be recovered by simplification of the duties of the network operator over time, which can result a saving of costs, human efforts, and network downtime. For example, the present embodiments include extra connectors for every five QSFP-DD connectors on the interface modules (e.g., packet modules, control modules, universal modules, etc.). However, the cabling within the auxiliary cabinets may need less jacketing or shielding compared with cables running around equipment in a data center. The present embodiments may result in a reduction in installation labor costs. Also, the cable granularity may increase by about four times. A large system not be limited to 20 fabric modules.

In an optical cable solution (e.g., embodiments described with respect to FIGS. 14 and 15), the systems of the present disclosure may be configured to enable separation of each housing (e.g., to reduce rack thermal density). Regarding link budget and signal integrity issues, the present disclosure includes extra connectors which may be effectively transparent to reflections since they would not be bent at a right angle, but instead may include straight-through connections through the auxiliary cabinets. Thicker cables (e.g., AWG twinax) can more than make up for connector IL. which may result in about 1 dB overall gain. The signal integrity can be maintained and loss can be minimized, which is not an issue with respect to the various embodiments of the present disclosure.

Figure 16:
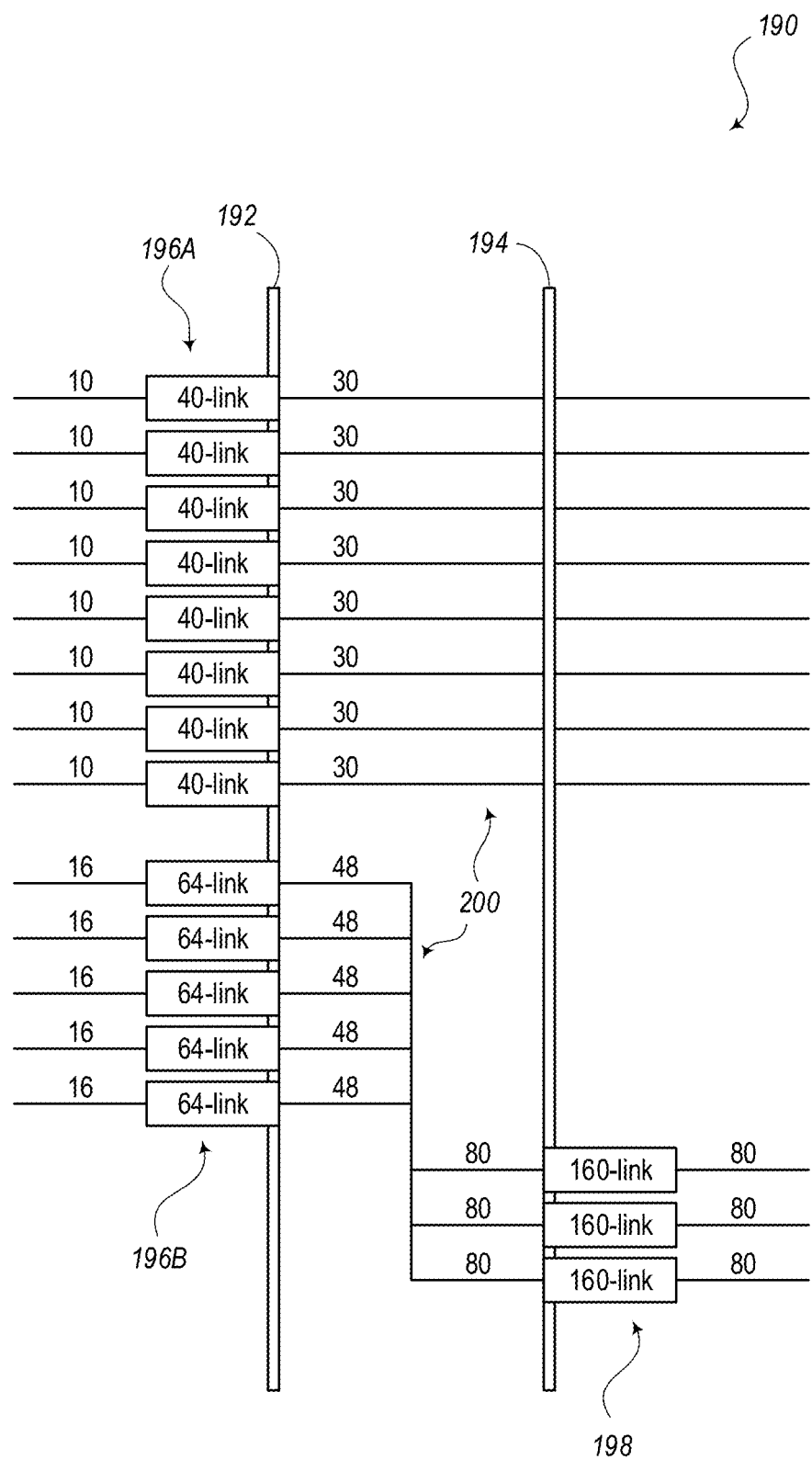
FIG. 16 is a schematic diagram illustrating internal wiring between a front panel of an auxiliary cabinet structure and a back panel of the auxiliary cabinet structure, according to various embodiments.

FIG. 16 is a schematic diagram illustrating an embodiment of internal wiring between a front panel and a back panel of an auxiliary cabinet structure 190 (e.g., any one or more of the auxiliary side cabinets 42, 44, 76, 78, 86, 88, 96, 98, 106, 108, 116, 117, 118, 126, 136, 138, 146, 148, 156, 158, 174, 176, etc. described through the present disclosure). More particularly, FIG. 16 shows an embodiment where thirteen connectors may be grouped together. For example, in some embodiments, the connectors may be part of a group associated with a single connector panel (e.g., any one or more of the connector panels 52, 54, 80, 90, 100A, 100B, 110A, 110B, 120A, 120B, 130, 140A, 140B, 150A, 150B, 160, 178, etc.). For example, the auxiliary cabinet structure 190 may include a front panel 192 and a back panel 194.

The front panel 192 may be a full panel for supporting a number of connector panels and connectors 196 (e.g., eight 40-link connectors 196A and five 64-link connectors 196B). In some embodiments, the connectors 196 may be Multifiber Push-On (MPO) connectors or other suitable types of optical fiber connectors. The front panel 192 may further include panel portions used for protecting the internal structure of the auxiliary cabinet structure 190.

The back panel 194 may be configured to support rear connectors 198 (e.g., three 160-link connectors). For example, the 64-link connectors 196B may include 16 links accessible from the front of the connectors 196B, while 48 links from each connector 196B may be connected in any suitable pattern (i.e., total of 240 links) to 80 links each of the three rear connectors 198. According to some embodiments, the back panel 194 may include pass-throughs for passing cables from a back portion of the connectors 196A, while, in other embodiments, the back panel 194 may be omitted from behind the connectors 196A to allow easy access to cable extending from the back portion of the connectors 196A.

Internally to the auxiliary cabinet structure 190 (or sideplane cassette), twinax cables may be used connect all the backplane-style connectors 196A, 196B in a pattern that performs a shuffle function. By removing auxiliary cabinet structure 190 from a rear portion of the main rack structure, upgrades to the modules can be achieved without having to disconnect other panels. In addition, the internal cables 200 may be twinax cables, optical cables, or other suitable cables, fibers, wires, or other electrical conductors or optical transmission media. In some cases, a single optical system may be configured to serve all the various systems described above, having different sizes and configurations. According to various embodiments, the auxiliary cabinet structure 190 may be configured with a number of loopback cables or plugs to enable interconnectivity via the front panel 192 and/or back panel 194 as needed.

FIGS. 17-22 are schematic diagrams illustrating examples of internal cabling within the auxiliary cabinet structure 190 of FIG. 16. A first set of bulkhead connectors 210A (e.g., eight 40-link connectors) and a second set of bulkhead connectors 210B (e.g., five 64-link connectors) may be arranged on a front panel of the auxiliary cabinet structure 190. Sets of cables 212A (e.g., one or more octopus cables) may be connected to one or more of the first set of connectors 210A. Sets of cables 212B (e.g., one or more octopus cables) may be connected to one or more of the second set of connectors 210B. These cables 212A, 212B may include bulkhead connectors one end for connection to connectors 210A, 210B and may include multiple legs for connection to multiple network equipment modules via QSFP-DD connectors 214.

Figure 17:
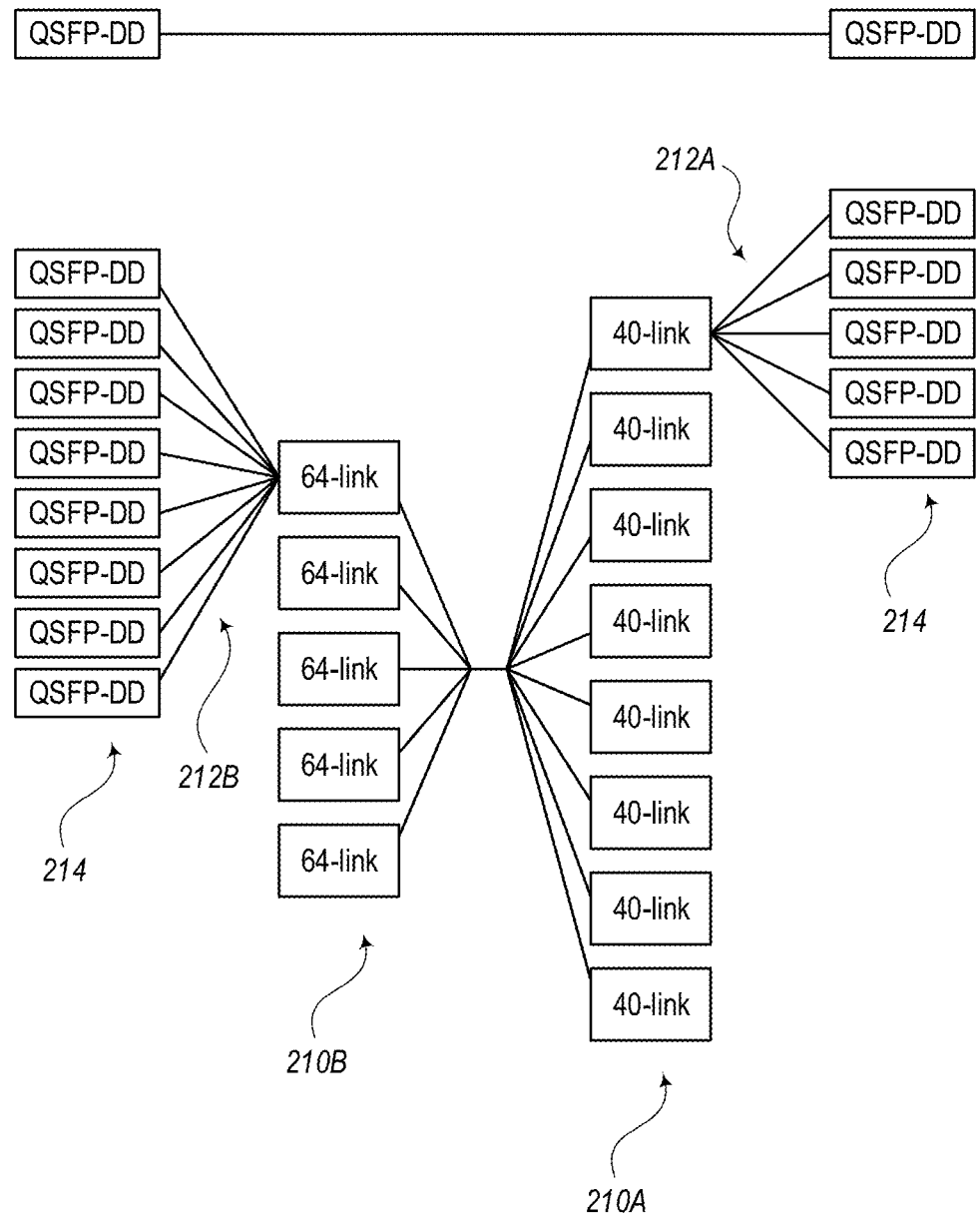
FIGS. 17-22 are schematic diagrams illustrating examples of internal wiring within an auxiliary cabinet structure and external cable connections for communication with multiple modules of network equipment, according to various embodiments.
Figure 18:
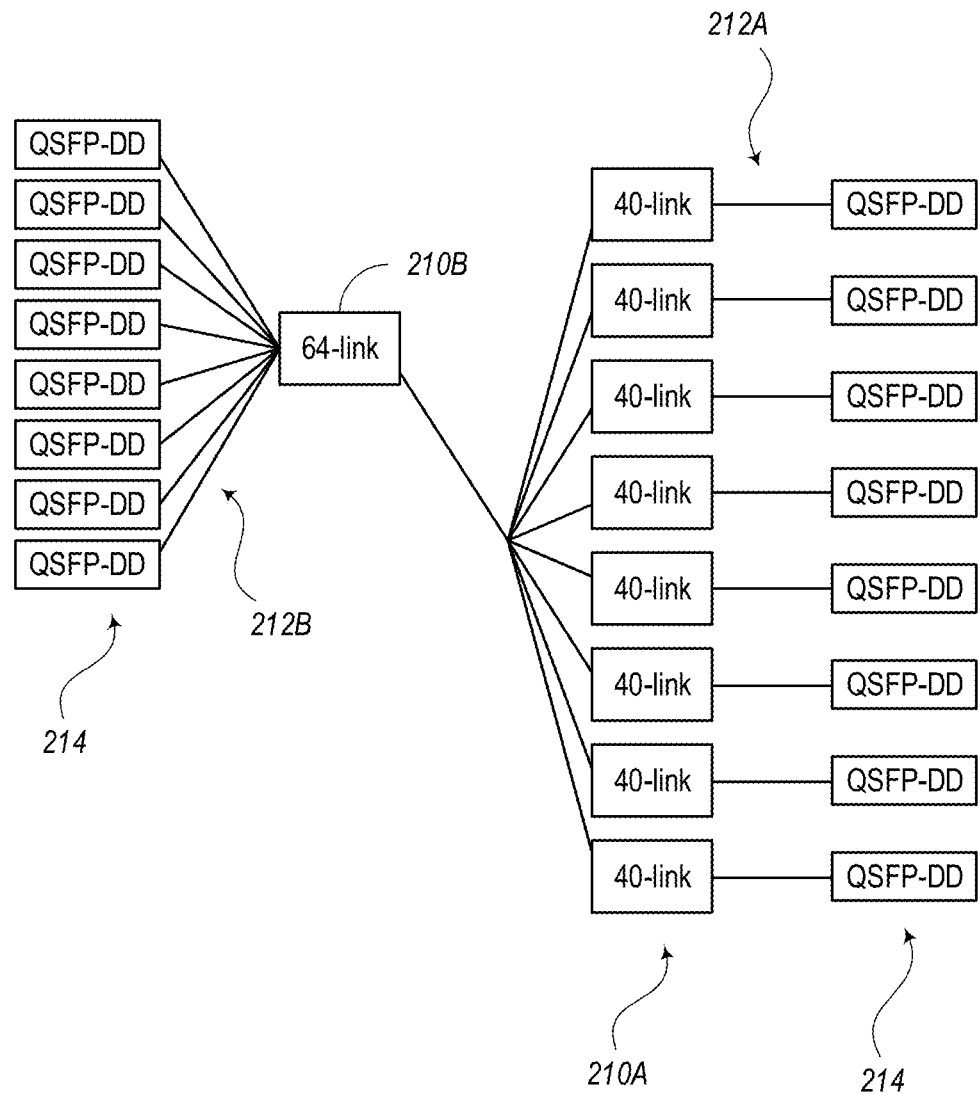
Figure 19:
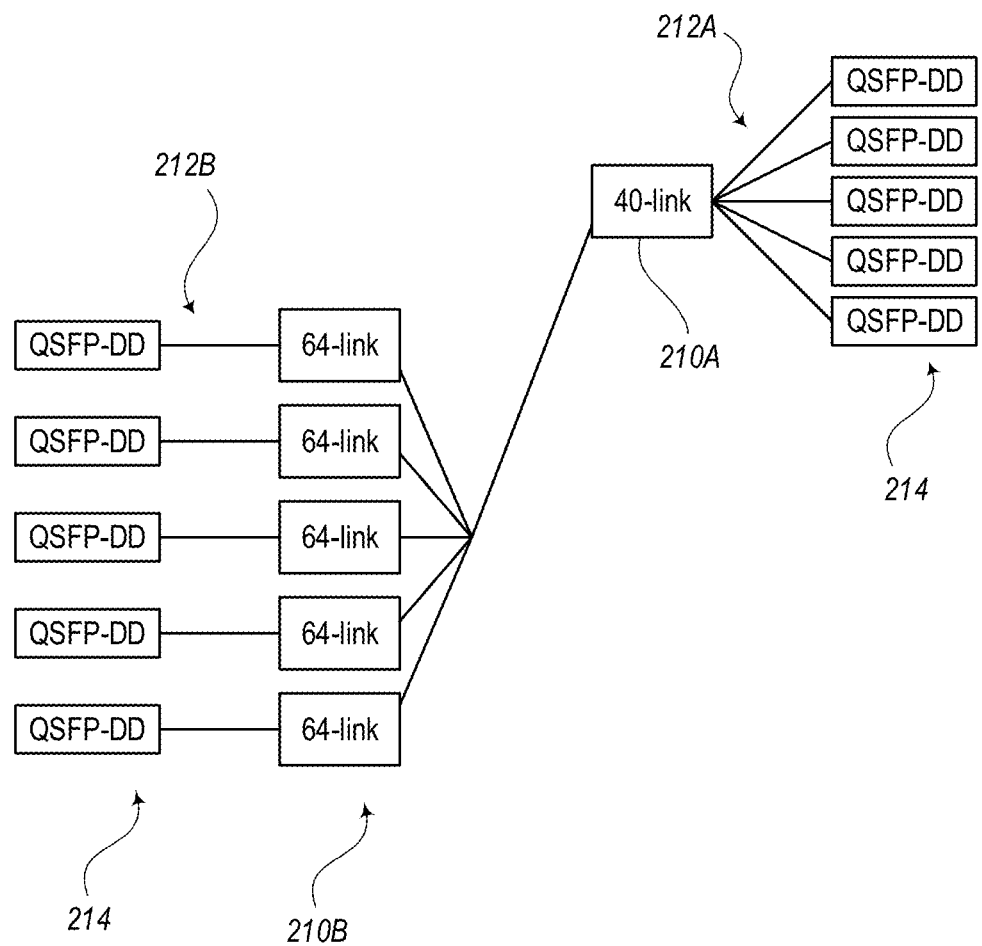

FIG. 17 shows internal cabling where 320 parallel links are arranged between the first set of connectors 210A and the second set of connectors 210B. FIG. 18 shows internal cabling where 64 parallel links are arranged between the first set of connectors 210A and a single connector 210B (of the second set). FIG. 19 shows internal cabling where 40 parallel links are arranged between a single connector 210A (of the first set) and the second set of connectors 210B.

Figure 20:
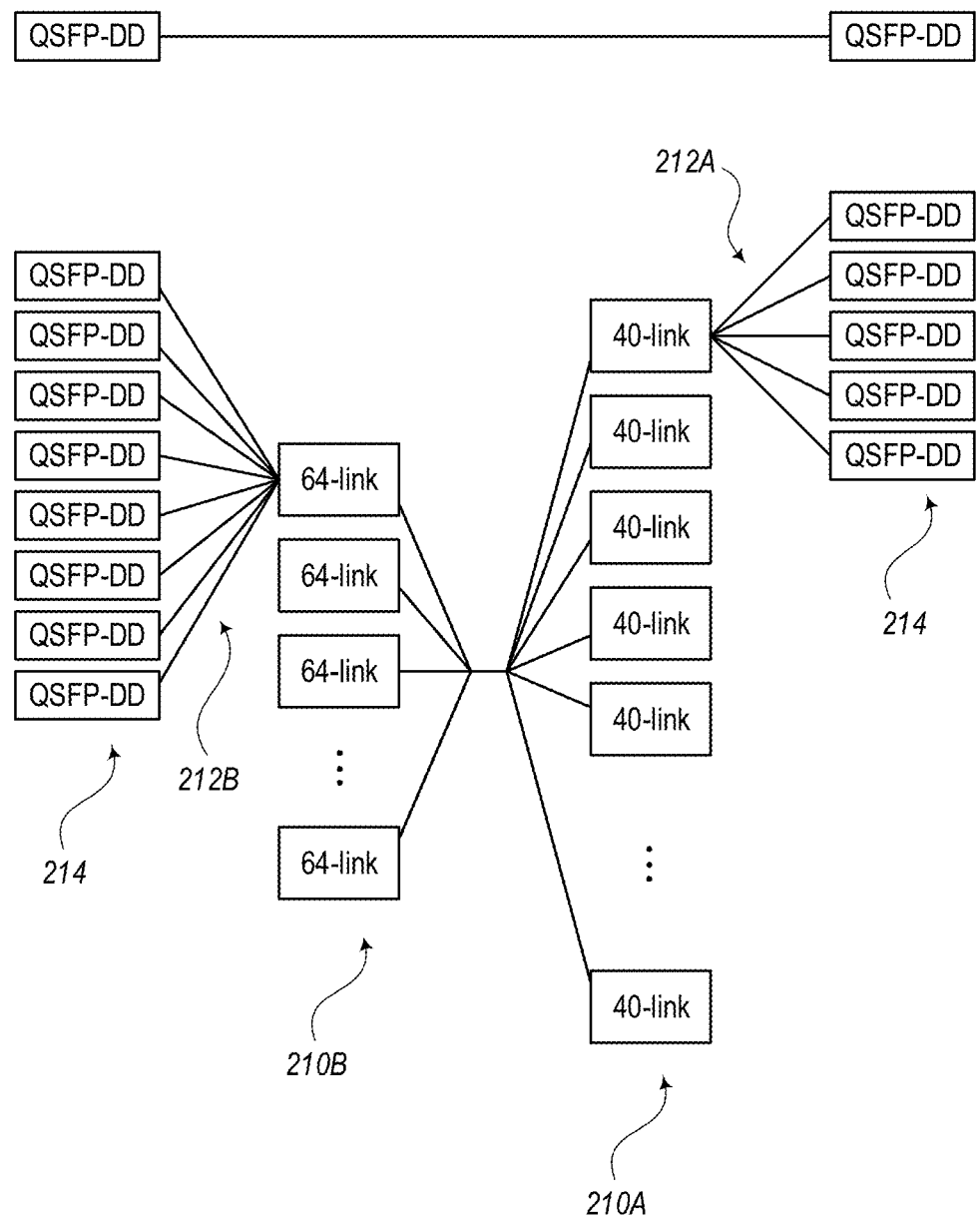
Figure 21:
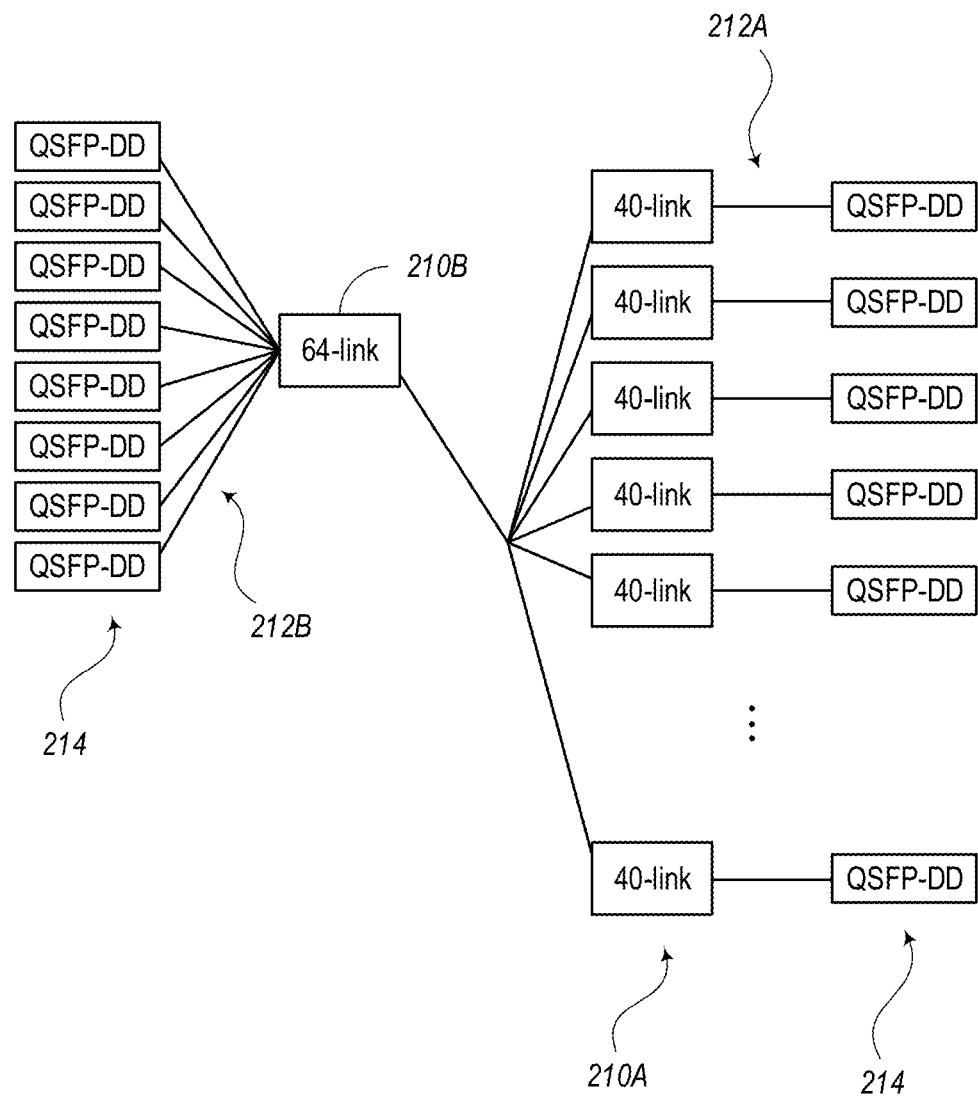
Figure 22:
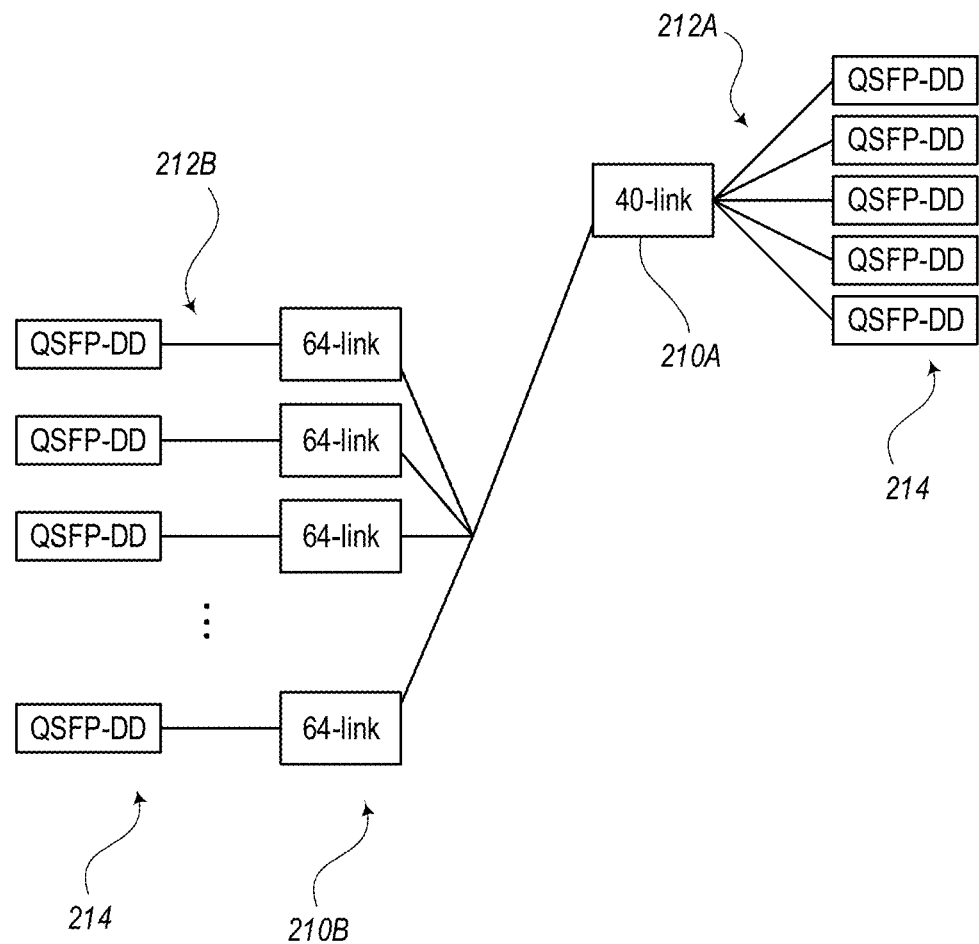

FIG. 20 shows internal cabling where 640 parallel links are arranged between a first set of connectors 210A (e.g., sixteen 40-link connectors) and a second set of connectors 210B (e.g., ten 64-link connectors). FIG. 21 shows internal cabling where 64 parallel links are arranged between the first set of sixteen connectors 210A and a single connector 210B (of the second set of ten connectors). FIG. 22 shows internal cabling where 40 parallel links are arranged between a single connector 210A (of the first set of sixteen connectors) and the second set of ten connectors 210B.

In the various internal cabling arrangements shown in FIGS. 16-22, the internal cables may be shuffled in a random or pseudo-random manner to enable variable connectivity to different fabric server devices in a network. In some example, the shuffled may be used to form various mesh connections to increase path protection alternatives. The shuffle function may have a granularity to a single link whereas QSFP-DD granularity may be eight links. The increased granularity may be configured to effectively increase the maximum size of a network system.

Also, the embodiments of the present disclosure may be configured to support variable-pitch linecards. Another advantage over conventional systems is that the present embodiments may be built in a factory with predetermined structure and predictability in a standard configuration, which can thereby reduce on-site cabling complexity for network operators.

Furthermore, the optical solutions of the various embodiments may have the advantage in that the size can easily be varied, whereby simple loopback connections can be used for simpler networks, which can then be replaced with suitable connections as needed when the network scales. The connector panels described in the present disclosure may include a set size and shape, but can be arranged in different ways on the front panel of the auxiliary side cabinets as needed. For example, the connectors panels may be arranged at any height on the front panels as needed and may be flipped upside down if necessary. This flexibility may be configured to reduce the number of auxiliary side cabinet Stock Keeping Units (SKUs).

The auxiliary side cabinets may also have the flexibility of being rear-removeable if necessary for upgradeability with minimal traffic hit. Operation in a stacked-chassis system, where outer auxiliary side cabinets can carry connectivity local to the associated main rack and any inner auxiliary side cabinets can create inter-rack connectivity. The connector panels and connectors can be mixed and matched as needed according to design. Also, the various connectors may be changed as needed to accommodate needed connectivity specifications, based on individual cables (e.g., DACs, AECs, AOCs). Furthermore, as shown in FIG. 11, the present disclosure also provides a system with adjustable-length extendable sections of the connector panels for greater flexibility based on the positioning of modules on the main rack. In the embodiment of FIG. 11, the different sections of a connector panel can be connected via a cable or umbilical connection between the sections, or alternatively may include a sliding connector mechanism.

The embodiments of the present disclosure may be configured with straight-through connections through the internal structure of the auxiliary side cabinets. Because of the straight-through connections, it is believed that the auxiliary side cabinets do not negatively affect signal integrity over the extra cable length and do not significantly increase signal crosstalk. Although the auxiliary side cabinets may slightly increase insertion loss through additional connectors, the system can counteract all or most of this increase by utilizing larger twinax AWG cabling inside the auxiliary side cabinets. Also, since the interior twinax cabling can be shorter and can be built into the cabinets at the factory, then this cabling does not need individual jackets for every 8 links, which can be an improvement over conventional systems.

Although the present disclosure has been illustrated and described herein with reference to various embodiments and examples, it will be readily apparent to those of ordinary skill in the art that other embodiments and examples may perform similar functions, achieve like results, and/or provide other advantages. Modifications, additions, or omissions may be made to the systems, apparatuses, and methods described herein without departing from the spirit and scope of the present disclosure. All equivalent or alternative embodiments that fall within the spirit and scope of the present disclosure are contemplated thereby and are intended to be covered by the following claims.

What is claimed is:

1. An rack structure comprising:
   a frame connected to a side portion of a main rack structure, the main rack structure configured to support a plurality of modules of a Network Element (NE) having front-facing connectors, wherein the frame is positioned side-by-side with the main rack structure and the plurality of modules when supported by the main rack structure;
   a front surface connected to the frame; and
   one or more connector panels arranged on the front surface, each of the one or more connector panels configured to support a plurality of connectors, the plurality of connectors are configured for communication with associated connectors of the modules of the NE via cables,
   wherein the plurality of connectors of each of the one or more connector panels arranged on the front surface are positioned side-by-side with the front-facing connectors of the plurality of modules when supported by the main rack structure,
   wherein the plurality of connectors of each of the one or more connector panels are positioned at an external surface of the frame and the front-facing connectors of the plurality of modules are positioned at an external surface of the main rack structure, and
   wherein each connector of the plurality of connectors is a multiple pin connector.

2. The rack structure of claim 1, wherein the frame includes a width that is less than a width of the main rack structure.

3. The rack structure of claim 1, further comprising a back panel that supports one or more fabric-facing connectors.

4. The rack structure of claim 3, further comprising internal cabling connecting the plurality of connectors with the fabric-facing connectors.

5. The rack structure of claim 4, wherein the internal cabling includes twin axial cables.

6. The rack structure of claim 4, wherein the internal cabling includes a shuffled arrangement.

7. The rack structure of claim 1, wherein the plurality of connectors are configured for connection with corresponding connectors of optical cables.

8. The rack structure of claim 7, wherein the corresponding connectors are Quad Small Form-factor Pluggable-Double-Density (QSFP-DD) connectors.

9. The rack structure of claim 1, wherein the plurality of connectors of each of the one or more connector panels are arranged on the respective connector panel in a vertical orientation.

10. The rack structure of claim 9, wherein the plurality of connectors include one or more 40-link connectors and one or more 64-link connectors.

11. The rack structure of claim 1, wherein a second auxiliary side cabinet is attached to an opposite side portion of the main rack structure.

12. The rack structure of claim 1, further comprising multiple connector panels having a same arrangement of front-facing connectors, wherein the one or more of the multiple connector panels includes a first set of connectors arranged in a right-side-up orientation and a second set of connectors arranged in an upside-down orientation.

13. The rack structure of claim 12, wherein the front-facing connectors include a first set of connectors configured for connection with packet modules, control modules, and universal modules of the NE mounted on the main rack structure and a second set of connectors configured for connection with fabric modules of the NE mounted on the main rack structure.

14. The rack structure of claim 13, wherein the first set of connectors are positioned on the respective connector panel near the packet modules, control modules, and universal modules, and wherein the second set of connectors are positioned on the respective connector panel near the fabric modules.

15. The rack structure of claim 1, further comprising multiple connector panels having multiple different arrangements of the plurality of connectors.

16. The rack structure of claim 1, wherein each of the one or more connector panels includes separate sections, and wherein a first type of connector is supported by a first section of the respective connector panel and a second type of connector is supported by a second section of the respective connector panel.

17. The rack structure of claim 1, wherein the cables for connecting the connectors with corresponding connectors of the modules of the NE are octopus cables having a bulkhead connector for connection with the connectors and multiple connectors for connection with multiple corresponding connectors of the modules of the NE.

18. The rack structure of claim 1, wherein the plurality of connectors include Multi-fiber Push-On (MPO) connecting elements.

19. A cable management structure comprising:
   a front surface connected to a frame connected to a side portion of a main rack structure, the main rack structure configured to support a plurality of modules of a Network Element (NE) having front-facing connectors, wherein the frame is positioned side-by-side with the main rack structure and the plurality of modules when supported by the main rack structure; and
   one or more connector panels arranged on the front surface, each of the one or more connector panels configured to support a plurality of connectors, the plurality of connectors configured for communication with associated connectors of the plurality of modules of the NE via cables, wherein the plurality of connectors of each of the one or more connector panels arranged on the front surface are positioned side-by-side with the front-facing connectors of the plurality of modules when supported by the main rack structure, wherein the plurality of connectors of each of the one or more connector panels are positioned at an external surface of the frame and the front-facing connectors of the plurality of modules are positioned at an external surface of the main rack structure, and wherein each connector of the plurality of connectors is a multiple pin connector.

20. The cable management structure of claim 19, further comprising:

a back panel configured to support one or more fabric-facing connectors; and internal cabling connecting the plurality of connectors with the fabric-facing connectors;

wherein the internal cabling includes twin axial cables with a shuffled arrangement.

* * * * *